US010020225B2

(12) United States Patent
Iwaya

(10) Patent No.: US 10,020,225 B2
(45) Date of Patent: Jul. 10, 2018

(54) METHOD OF MANUFACTURING SEMICONDUCTOR DEVICE

(71) Applicant: Renesas Electronics Corporation, Koutou-ku, Tokyo (JP)

(72) Inventor: Akihiko Iwaya, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/791,408

(22) Filed: Oct. 23, 2017

(65) Prior Publication Data

US 2018/0047629 A1 Feb. 15, 2018

Related U.S. Application Data

(63) Continuation of application No. 15/201,468, filed on Jul. 3, 2016, now Pat. No. 9,805,981.

(30) Foreign Application Priority Data

Aug. 28, 2015 (JP) .................................. 2015-169323

(51) Int. Cl.
| | |
|---|---|
| *H01L 23/00* | (2006.01) |
| *H01L 21/78* | (2006.01) |
| *H01L 23/495* | (2006.01) |
| *H01L 23/31* | (2006.01) |

(52) U.S. Cl.
CPC ........ *H01L 21/78* (2013.01); *H01L 23/49558* (2013.01); *H01L 23/3107* (2013.01); *H01L 23/49541* (2013.01); *H01L 2224/32245* (2013.01); *H01L 2224/48091* (2013.01); *H01L 2224/48247* (2013.01); *H01L 2224/73265* (2013.01); *H01L 2924/181* (2013.01)

(58) Field of Classification Search
CPC .................................................. H01L 23/3107
See application file for complete search history.

(56) References Cited

U.S. PATENT DOCUMENTS

| | | | | |
|---|---|---|---|---|
| 5,336,927 A | * | 8/1994 | Suetake | ............ H01L 23/49558 257/666 |
| 5,872,394 A | * | 2/1999 | Shinohara | ......... H01L 23/49558 257/666 |
| 7,847,376 B2 | | 12/2010 | Takahashi | |

FOREIGN PATENT DOCUMENTS

| | | |
|---|---|---|
| JP | 2006-332241 A | 12/2006 |
| JP | 2009-044114 A | 2/2009 |

(Continued)

*Primary Examiner* — William Harriston
(74) *Attorney, Agent, or Firm* — Shapiro, Gabor and Rosenberger, PLLC

(57) ABSTRACT

An object of the present invention is to improve the reliability of a semiconductor device.
A semiconductor device has a first lead group comprised of a plurality of first leads, a second lead group comprised of a plurality of second leads, and a first suspension lead arranged between the first lead group and the second lead group. Further, the semiconductor device has a first tape attached to each of the first leads, the first suspension lead, and some of the second leads, and a second tape attached to each of the second leads. Further, the first tape has a lead holding part attached to each of the first leads, and a tape supporting part attached to the first suspension lead and some of the second leads and is attached to a position farther from wire connecting portion than the lead holding part.

21 Claims, 21 Drawing Sheets

(56) References Cited

FOREIGN PATENT DOCUMENTS

| JP | 2010-278308 A | 12/2010 |
|----|---------------|---------|
| JP | 2013-120768 A | 6/2013  |

* cited by examiner

METHOD OF MANUFACTURING SEMICONDUCTOR DEVICE

CROSS-REFERENCE TO RELATED APPLICATIONS

The disclosure of Japanese Patent Application No. 2015-169323 filed on Aug. 28, 2015 including the specification, drawings and abstract is incorporated herein by reference in its entirety.

BACKGROUND

The present invention relates to a semiconductor device, and, for example, a technique effective in application to a semiconductor device in which a semiconductor chip is coupled to a plurality of leads through a plurality of wires.

Each of Japanese Unexamined Patent Application Publication No. 2013-120768 and Japanese Unexamined Patent Application Publication No. 2009-44114 describes a structure in which a frame-like (ring shape) tape material is attached to the outside of wire joint regions of a plurality of leads coupled to a semiconductor chip.

Further, each of Japanese Unexamined Patent Application Publication No. 2010-278308 and Japanese Unexamined Patent Application Publication No. 2006-332241 describes a structure in which tapes attached to leads are configured using a plurality of members that are separated from each other.

There is a technique in which a tape is attached across a plurality of leads and suspension leads arranged adjacent to the leads to suppress the deformation of the leads during a manufacturing process. In particular, if the tape is attached near wire connecting portion to which wires are coupled, the deformation around the wire connecting portion can be suppressed.

Here, the acquisition efficiency of tapes for suppressing the deformation of leads will be examined. A case in which one tape formed in a frame shape is used is compared with a case in which a plurality of tapes formed not in a frame shape (namely, tapes formed in nearly a strip shape) is used, the acquisition efficiency is higher in the latter case.

However, in the case where a plurality of tapes is used, it is necessary to prevent the tapes from being overlapped with each other in order to reliably attach the tapes to each of the leads. As a method of preventing the tapes from being overlapped with each other, there is a method of attaching the tapes to the leads while being part from each other.

Here, in order to shorten the length of each wire coupled to the lead, the wire is preferably coupled to a tip end part of the lead. Therefore, in order to suppress the deformation around the wire connecting portion, the tape is preferably attached near the tip end part of each lead.

However, it is necessary to attach, at least, one of the tapes at a position apart from the tip end parts of the leads, namely, the wire connecting portion (coupling points) in the above-described method.

It should be noted that as another method of preventing the tapes from being overlapped with each other, there is a method in which, for example, the width of a suspension lead or a part thereof arranged between the leads is increased to attach an end part of each tape to the suspension lead or a part thereof. In this case, however, it is difficult to downsize the semiconductor device due to an increase in the width of the suspension lead. Or, it is difficult to increase the number of leads that can be arranged in one semiconductor device. Namely, an increase in the width of the suspension lead causes a reduction in the number of terminals per unit area of the semiconductor device.

The other objects and novel features will become apparent from the description of the specification and the accompanying drawings.

A semiconductor device according to an embodiment has a first lead group comprised of a plurality of first leads, a second lead group comprised of a plurality of second leads, and a first suspension lead arranged between the first lead group and the second lead group. Further, the semiconductor device has a first tape attached to each of the first leads, the first suspension lead, and some of the second leads, and a second tape attached to each of the second leads. Further, the first tape has a first part attached to each of the first leads, and a second part attached to the first suspension lead and some of the second leads and is attached to a position farther from wire connecting portion than the first part.

According to the above-described embodiment, it is possible to improve the reliability of a semiconductor device.

BRIEF DESCRIPTION OF THE DRAWINGS

FIG. 3 is a perspective plan view for showing an inner structure of the semiconductor device in a state where a sealing body shown in FIG. 1 is seen through;

Figure 1:
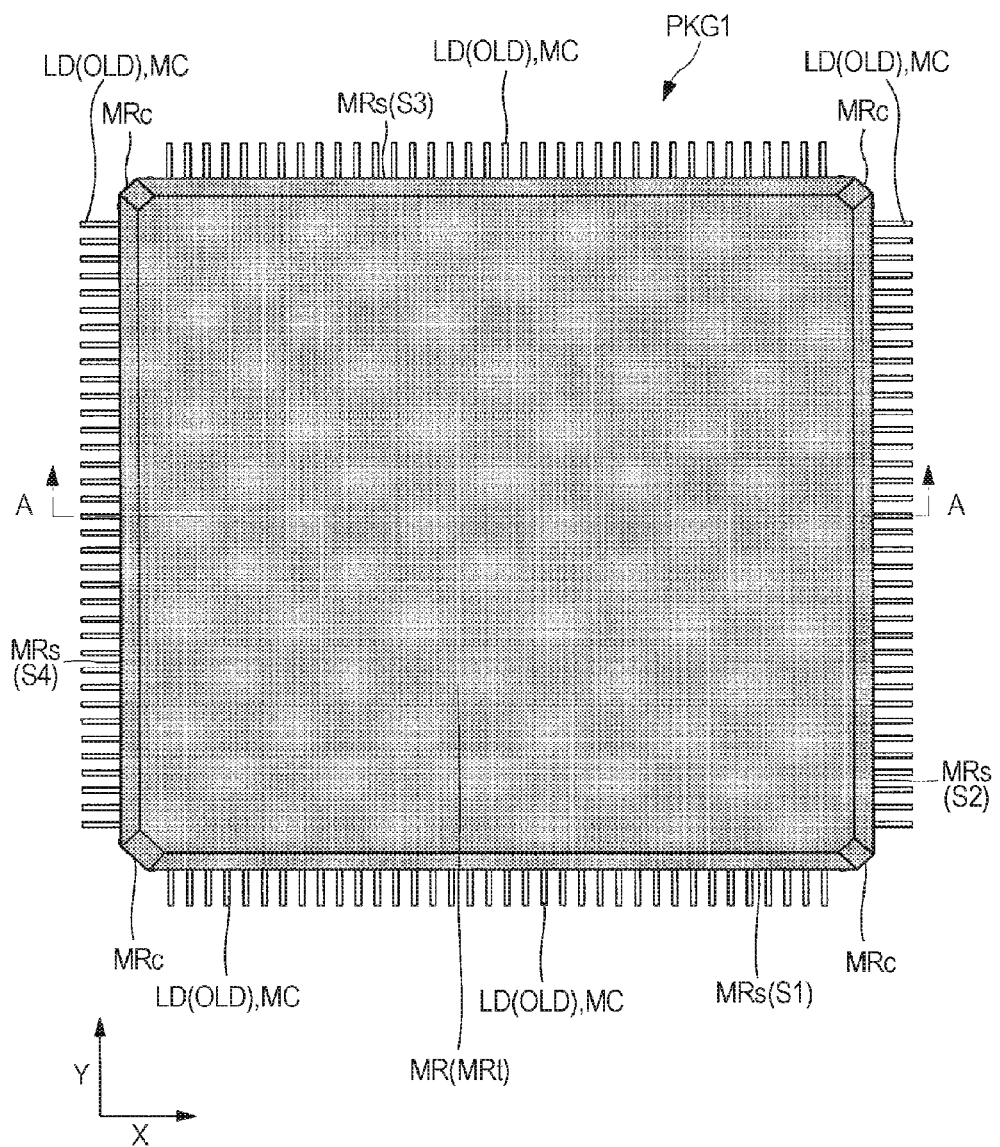
FIG. 1 is a top view of a semiconductor device according to an embodiment.

DETAILED DESCRIPTION (Explanation of Description Form and Basic Terms and Usage in the Application)

An embodiment will be described in the application by being divided into a plurality of sections if necessary for convenience sake. However, the sections are not independent and separated from each other except when specifying not so, but each part of a single example of one section corresponds to a part of details or a part or all of a modified example or the like of the other section irrespective of the former and latter parts of the description. Further, the same parts are not repeatedly explained in principle. Further, the respective constitutional elements in the embodiment are not essential except when specifying not so, except for a case in which the number of constitutional elements is theoretically limited to the specified number, and except for a case in which the respective constitutional elements are obviously essential from the context.

Likewise, in the description of the embodiment or the like, "X made of A" in terms of material, compositions, and the like does not exclude those containing elements other than A except when specifying not so and except for a case in which "X made of A" obviously excludes those containing elements other than A. For example, this applies to the meaning of "X composed mainly of A" in the case of components. For example, it is obvious that a "silicon member" or the like is not limited to genuine silicon, but includes a member containing SiGe (silicon-germanium) alloy, multicomponent alloy composed mainly of silicon, or other additives. Further, gold plating, a Cu layer, nickel plating, and the like include not only genuine ones but also members composed mainly of gold, Cu, nickel, and the like except when specifying not so.

Further, when a specific value or quantity is mentioned, the value may be smaller or larger than the specific value except when specifying not so, except for a case in which the value is theoretically limited to the specific value, and except for a case in which the value is not obviously smaller or larger than the specific value from the context.

Further, the same or similar parts are represented by the same or similar signs or reference numerals in each drawing of the embodiment, and the explanations thereof are not repeated in principle.

Further, in the accompanying drawings, hatchings or the like are omitted in some cases even in a cross-sectional view when being complicated by the hatchings or when a void is clearly distinguished. In connection with this, even in the case of a closed hole in plan view, the outlines of the background are omitted in some cases when being apparent from explanation or the like. Further, hatchings or dot patterns are illustrated in some cases in order to clearly specify not a void or to clearly specify a boundary between regions even in a drawing other than a cross-sectional view.

<Outline of Semiconductor Device>

Figure 2:
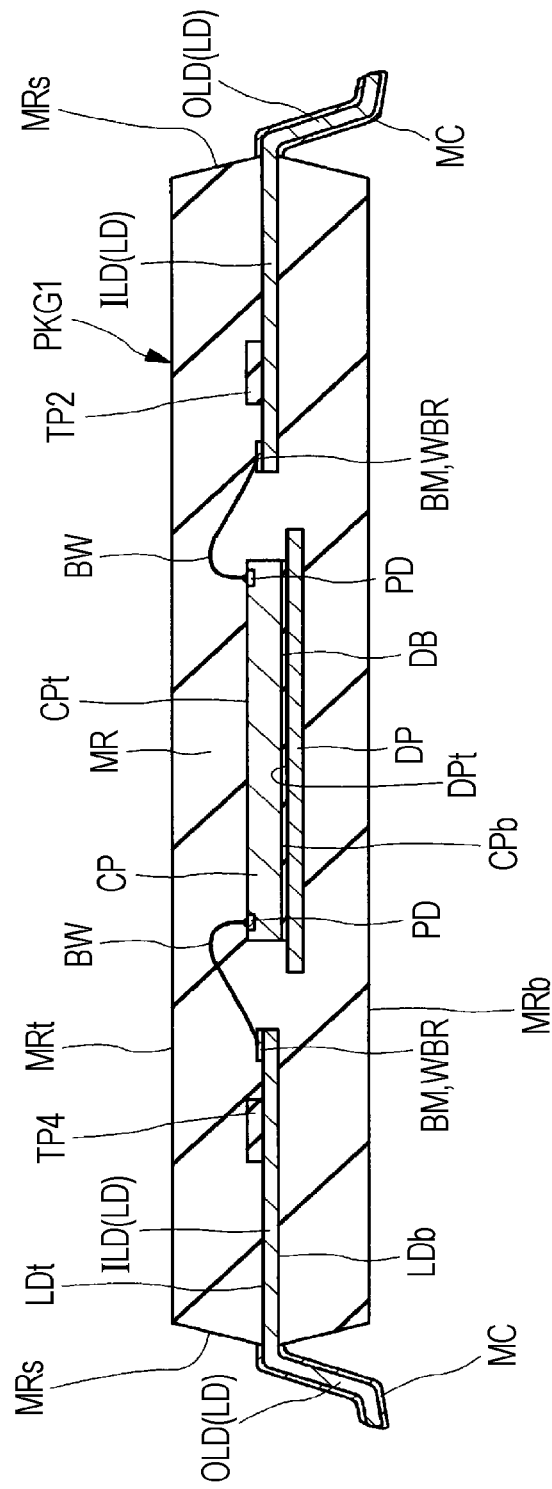
FIG. 2 is a cross-sectional view along the line A-A of FIG. 1.
Figure 3:
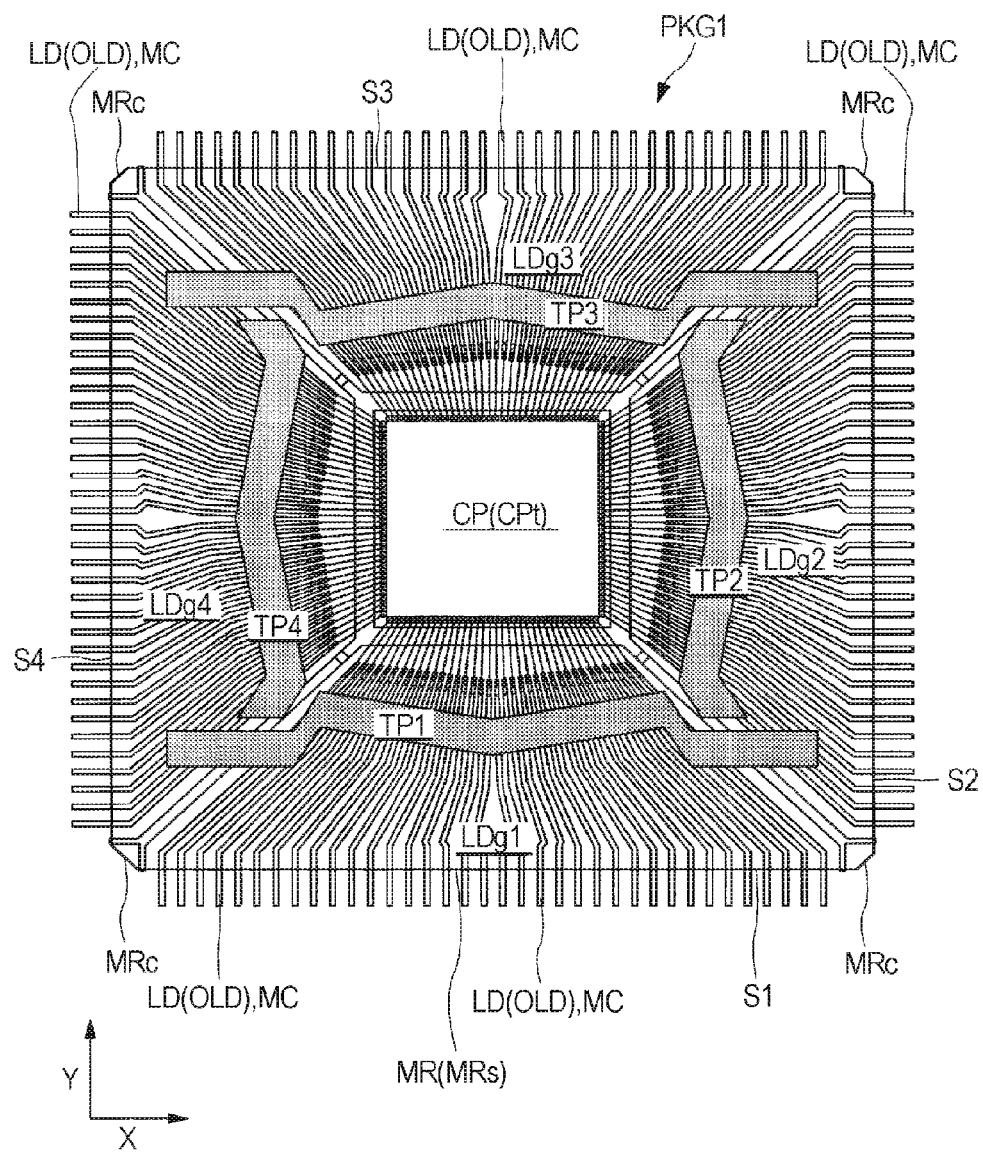
Figure 4:
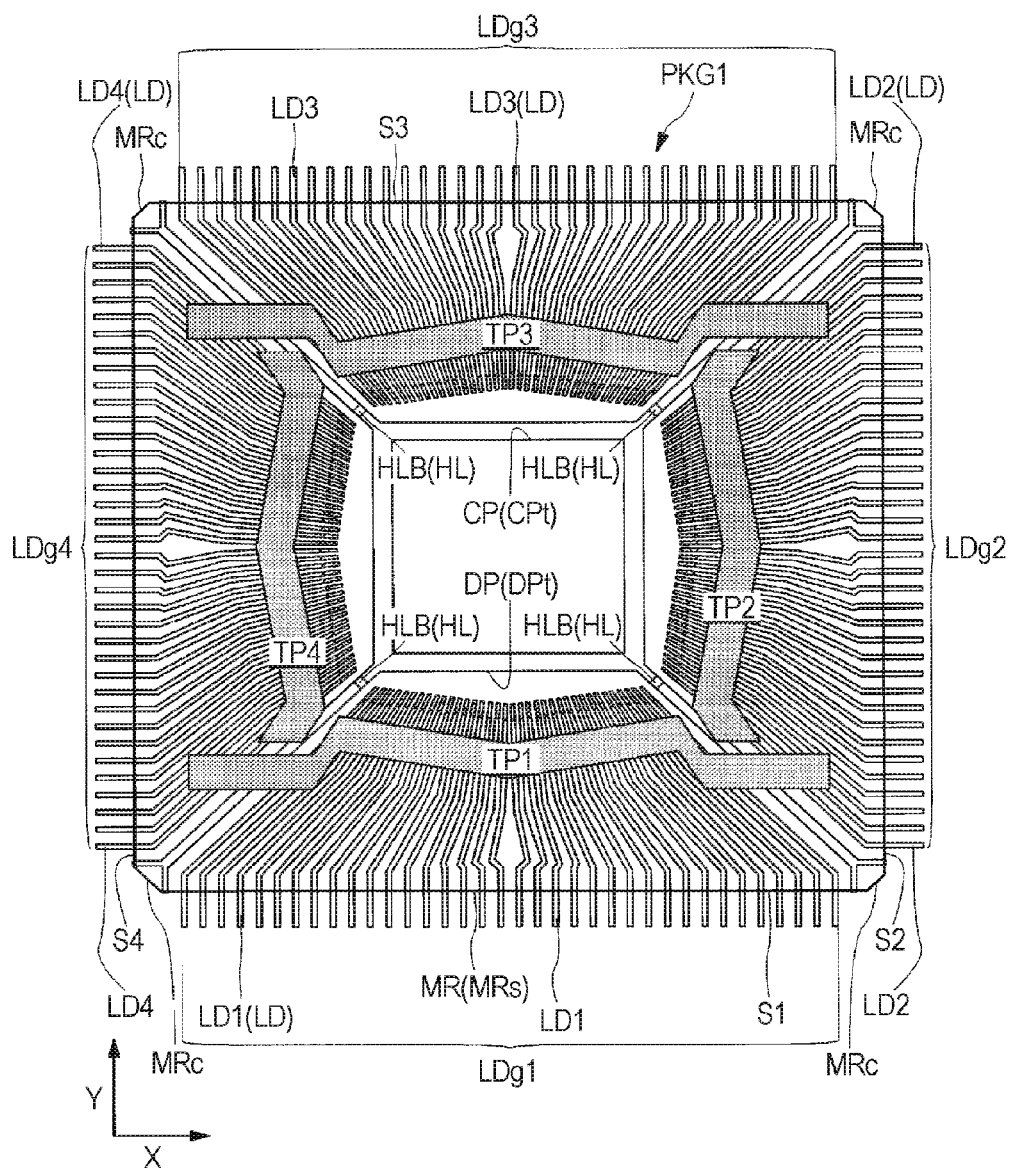
FIG. 4 is a perspective plan view for showing a state in which a plurality of wires and pads of a semiconductor chip shown in FIG. 3 are removed.

First, an outline of a configuration of a semiconductor device PKG1 according to an embodiment will be described using FIG. 1 to FIG. 4. FIG. 1 is a top view of a semiconductor device according to the embodiment. Further, FIG. 2 is a cross-sectional view along the line A-A of FIG. 1. Further, FIG. 3 is a perspective plan view for showing an inner structure of the semiconductor device in a state where a sealing body shown in FIG. 1 is seen through. Further, FIG. 4 is a perspective plan view for showing a state in which a plurality of wires and pads of a semiconductor chip shown in FIG. 3 are removed.

As shown in FIG. 1 to FIG. 4, a semiconductor device PKG1 has a semiconductor chip CP (see FIG. 2 and FIG. 3), a plurality of leads as external terminals arranged around the semiconductor chip CP, and a plurality of wires BW (see FIG. 2) as conductive members that electrically couple the semiconductor chip CP to the leads LD. Further, the semiconductor chip CP and the wires BW are sealed with a sealing body (resin body) MR. Further, an inner lead part ILD (see FIG. 2) of each of the leads LD is sealed with the sealing body MR, and an outer lead part OLD of each of the leads LD is exposed from the sealing body MR.

As shown in FIG. 1, the plan shape of the sealing body MR included in the semiconductor device PKG1 is a quadrangular shape. The sealing body MR has an upper surface MRt, a lower surface (a back surface or a mounted surface) MRb (see FIG. 2) opposite to the upper surface MRt, and a plurality of (four) side surface MRs (see FIG. 1 and FIG. 2) located between the upper surface MRt and the lower surface MRb.

Further, as shown in FIG. 1 and FIG. 3, the sealing body MR has a side (a main side) S1 extending (stretching) along the X direction and a side (a main side) S2 extending along the Y direction intersecting with (in FIG. 1, orthogonal to) the X direction in plan view. Further, the sealing body MR has a side S3 opposite to the side S1 and extends along the X direction, and a side S4 opposite to the side S2 and extends along the Y direction. As shown in FIG. 1, the four side surfaces MRs included in the sealing body MR are arranged along the respective sides of the sealing body MR. Further, in the example shown in FIG. 1, corner parts MRc at which the respective sides of the sealing body MR intersect with each other are chamfered.

Here, each corner part MRc of the sealing body MR includes a peripheral region of the corner that is an intersection point of arbitrary two sides (two main sides) that intersect with each other among the four sides (four main sides) of the sealing body MR. Strictly, it should be noted that each corner part MRc of the sealing body MR is chamfered as shown in FIG. 1 and FIG. 3 (FIG. 1 shows an example of taper machining, but may be R machining), and thus the intersection point of the main sides is arranged on the outer side relative to each corner part MRc of the sealing body MR. However, the chamfered part is sufficiently small as compared to the length of the main side, and thus the center of the chamfered part is regarded as a corner of the sealing body MR in the description of the application. Namely, in the case where a region where arbitrary two sides (two main sides) among the four sides (four main sides) of the sealing body MR intersect with each other is chamfered, the chamfered part corresponds to the corner part MRc in the application. In the case where the region is not chamfered, the intersection point of the arbitrary two sides (two main sides) corresponds to the corner part MRc. Hereinafter, when the corner part MRc of the sealing body MR is explained in the application, the meaning and content are the same as the above description except when specifying that the meaning and content are different.

Further, the leads LD are arranged along each side (each main side) of the sealing body MR that is quadrangular in a plan shape in the semiconductor device PKG1. The leads LD are made of metal material, and are metal members composed mainly of, for example, copper (Cu) in the embodiment.

As shown in FIG. 2, the outer lead parts OLD of the leads LD protrude towards the outer sides of the sealing body MR in the side surfaces MRs of the sealing body MR. Further, on the exposed surface of the outer lead part OLD of each lead LD, a metal film (an exterior plating film) MC is formed on, for example, the surface of a base material composed mainly of copper. The metal film MC is made of metal material such as solder that is superior in wettability against solder to copper that is a base material, and is a metal coating film coating the surface of a copper member that is a base material. The metal film MC made of solder or the like is formed at the outer lead part OLD of each lead LD that is an external terminal of the semiconductor device PKG1. Thus, the wettability of the solder material that is a conductive coupling material can be improved when the semiconductor device PKG1 is mounted on a mounting substrate. Accordingly, the joint area between the leads LD and the solder material is increased, and thus the joint strength between the leads LD and terminals on the mounting substrate side can be improved.

The metal film MC is, for example, an Sn—Pb solder material containing lead (Pb) or a solder material made of so-called lead-free solder that does not substantially contain Pb. As an example of the lead-free solder, there is, for example, tin (Sn), tin-bismuth (Sn—Bi), tin-copper-silver (Sn—Cu—Ag), or tin-copper (Sn—Cu). In this case, the lead-free solder means solder with a lead (Pb) content of 0.1 wt % or lower, and the content is defined as the standard of the RoHS (Restriction of Hazardous Substances) Directive.

It should be noted that FIG. 2 shows an example in which the metal film MC that is a solder film is formed on the exposed surface of the outer lead part OLD of each lead LD by a plating method. However, there are various modified examples for the metal film MC. For example, the metal film MC may be a lamination film of a metal film composed mainly of nickel (Ni) and a metal film composed mainly of palladium (Pd). Alternatively, for example, a metal film composed mainly of gold (Au) may be further laminated on the surface of the metal film composed mainly of palladium. Further, in the case where the metal film MC is configured using material other than solder, the metal film MC may be formed so as to cover the surfaces of the inner lead parts ILD and the outer lead parts OLD of the leads LD.

Further, as shown in FIG. 2 and FIG. 3, the semiconductor chip CP is sealed inside the sealing body MR. As shown in FIG. 3, the semiconductor chip CP has a quadrangular shape in plan view, and a plurality of pads (bonding pads) PD is provided on a top surface CPt along four sides configuring the outer edges of the top surface CPt. Further, the semiconductor chip CP (specifically, a semiconductor substrate) is made of, for example, silicon (Si). Although not shown in the drawing, a plurality of semiconductor elements (circuit elements) is formed on the main surface (specifically, a semiconductor element formation region provided on the upper surface of the semiconductor substrate of the semiconductor chip CP) of the semiconductor chip CP. In addition, the pads PD are electrically coupled to the semiconductor elements through wirings (not shown) formed in a wiring layer arranged inside (specifically, between the top surface CPt and the semiconductor element formation region (not shown)) of the semiconductor chip CP.

Further, an insulating film covering the substrate and the wirings of the semiconductor chip CP is formed on the top surface CPt of the semiconductor chip CP, and the surface of each of the pads PD is exposed from the insulating film in an opening formed in the insulating film. Further, the pads PD are made of metal, and are made of, for example, aluminum (Al) in the embodiment.

Further, for example, the leads LD are arranged around the semiconductor chip CP (in other words, around the die pad DP). In addition, the pads (bonding pads) PD exposed from the top surface CPt of the semiconductor chip CP are electrically coupled to the inner lead parts ILD of the leads LD located inside the sealing body MR through the wires (conductive members) BW. The wires BW are made of, for example, gold (Au) or copper (Cu), a part (for example, one end part) of each wire BW is joined to the pad PD, and the other part (for example, the other end part) is joined to a bonding region (a region to which a part of each wire BW is coupled) WBR (see FIG. 2) of each inner lead part ILD.

In the example of the embodiment, the metal film (a plating film or a plating metal film) BM (see FIG. 2) is formed on the bonding region WBR of each inner lead part ILD. As shown in FIG. 2, the metal film BM is partially formed at a part (the upper surface LDt of the tip end part closest to the semiconductor chip CP) of each inner lead part ILD. The metal film BM is made of material (for example, a lamination structure in which a thin gold film is formed on a palladium film) composed mainly of, for example, silver (Ag), gold, or palladium. The metal film BM made of material composed mainly of silver, gold, or palladium is formed on the surface of the bonding region WBR of each inner lead part ILD, so that the joint strength against the wires BW made of gold can be improved.

It should be noted that there are various modified examples for a region where the metal film BM is formed. For example, the metal film BM may be formed so as to cover the inner lead parts ILD and the entire exposed surfaces of the outer lead parts OLD. In this case, since the outer lead parts OLD are covered with the metal film BM, it is not necessary to form the metal film MC shown in FIG. 2.

Further, as shown in FIG. 2 and FIG. 4, the semiconductor chip CP is mounted on the die pad DP that is a chip mounting part. In the example shown in FIG. 4, an upper surface (a chip mounting surface) DPt of the die pad DP has a quadrangular shape whose area is larger than that of the top surface CPt of the semiconductor chip CP. The die pad DP is a support member for supporting the semiconductor chip CP, and there are various modified examples in addition to the example shown in FIG. 4. For example, the plan shape of the die pad DP may be a circular shape. Further, for example, the area of the upper surface DPt of the die pad DP may be smaller than that of the top surface CPt of the semiconductor chip CP.

Further, a plurality of suspension leads HL is arranged around the die pad DP as shown in FIG. 4. The suspension leads HL are members for supporting the die pad DP at a supporting part (a frame part) of a lead frame in a manufacturing process of the semiconductor device PKG1, and one end part of each suspension lead HL is coupled to the die pad DP. In the example shown in FIG. 4, four suspension leads HL extending from a part of the die pad DP towards the respective four corner parts MRc of the sealing body MR are coupled to the die pad DP.

Specifically, one end parts included in the suspension leads HL are connected to the corner parts (corners) of the die pad DP. Further, the other end parts included in the suspension leads HL extend towards the corner parts MRc of the sealing body MR, and each end part is divided into two near the corner part MRc to be exposed from the sealing body MR in the side surface MRs of the sealing body MR. Since the suspension leads HL are allowed to extend towards the corner parts MRc of the sealing body MR, the array of the leads LD arranged along each side (each main side) of the sealing body MR is hardly inhibited by the suspension leads HL.

Further, the upper surface DPt of the die pad DP is different in height from the upper surface of the inner lead part ILD of each lead LD in the embodiment. In the example shown in FIG. 2, the upper surface DPt of the die pad DP is arranged at a position lower than the upper surface LDt of each inner lead part ILD. Therefore, an offset part (a bent part or a down-set part in the example of the embodiment) HLB bent so that the height of the upper surface DPt of the die pad DP is positioned differently from that of the upper surface LDt (see FIG. 2) of the inner lead part ILD of each lead LD is provided at each of the suspension leads HL shown in FIG. 4.

Further, the semiconductor chip CP is mounted in the middle of the die pad DP. As shown in FIG. 2, the semiconductor chip CP is mounted on the die pad DP through a die bond material (an adhesive) DB in a state where the back surface CPb faces the upper surface DPt of the die pad DP. Namely, the semiconductor chip CP is mounted on the die pad DP by a so-called face-up mounting method in which the surface (back surface CPb) opposite to the top surface (main surface) CPt on which the pads PD are formed is allowed to face the chip mounting surface (upper surface DPt). The die bond material DB is an adhesive used for die bonding of the semiconductor chip CP, and, for example, a resin adhesive obtained by containing metal particles made of silver or the like in epoxy thermosetting resin or a metal joint material such as a solder material is used.

<Lead Layout>

Figure 5:
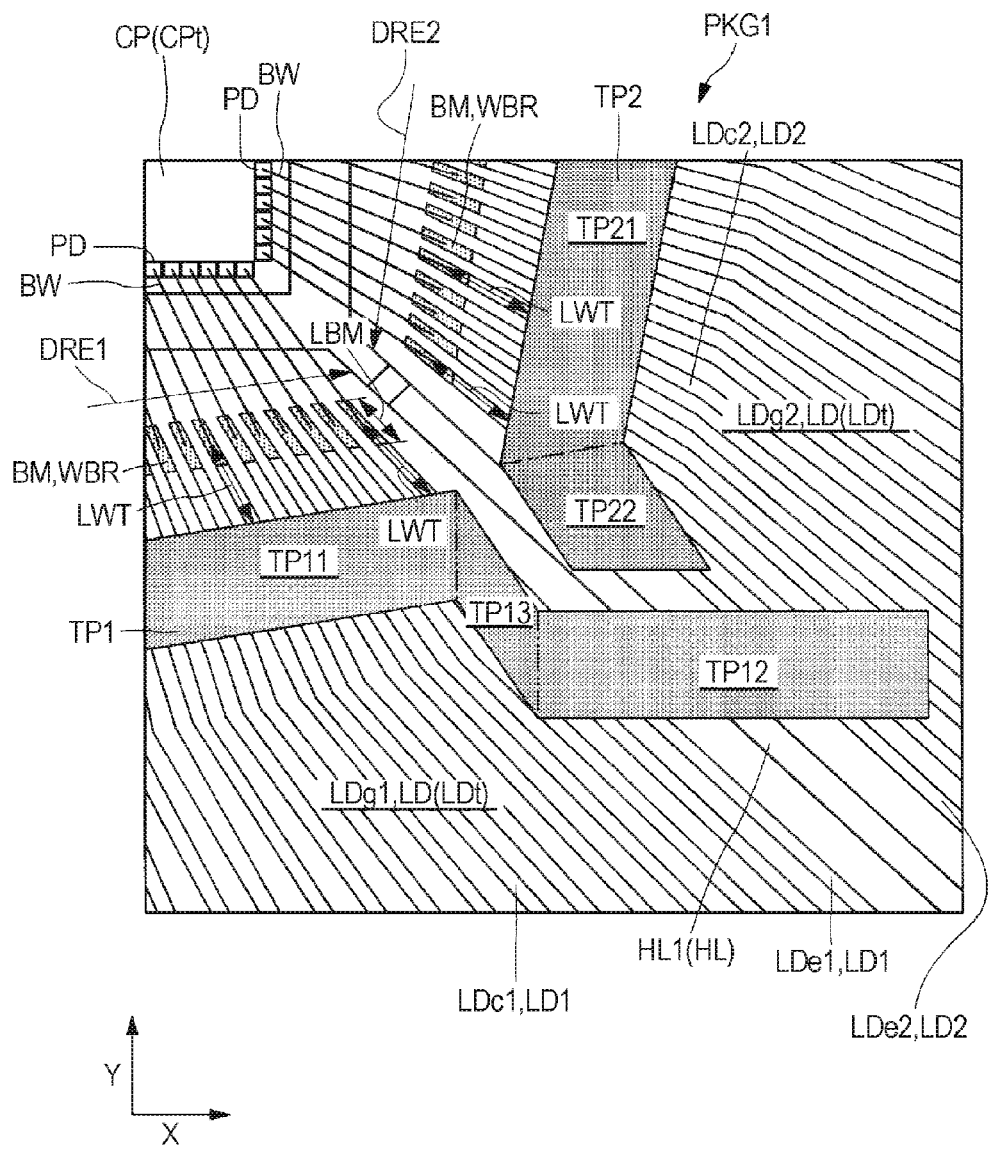
FIG. 5 is an enlarged plan view for showing the circumference of one of a plurality of suspension leads shown in FIG. 3 while enlarging the same.
Figure 6:
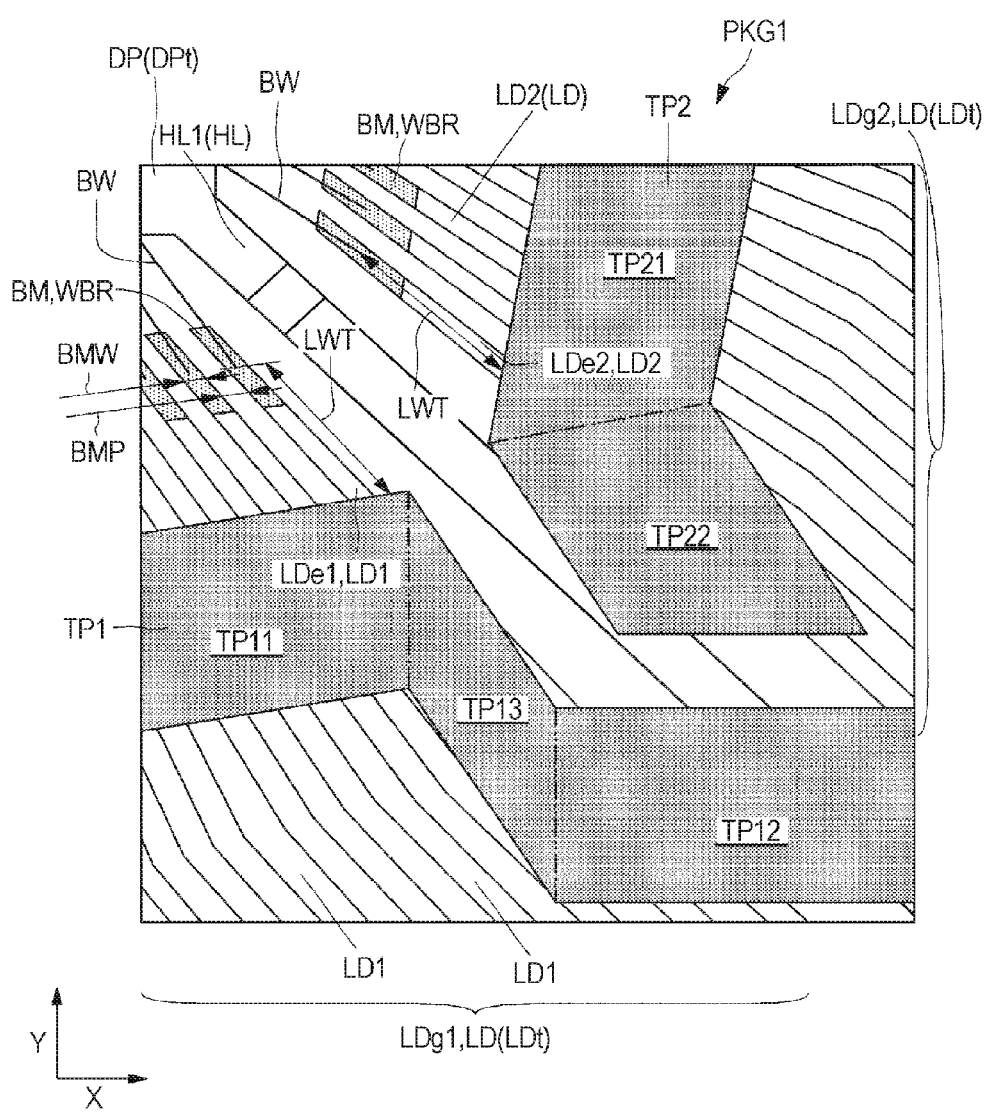
FIG. 6 is an enlarged plan view for showing the circumference of an end-part lead shown in FIG. 5 while further enlarging the same.

Next, the layout of a plurality of leads of the embodiment will be described in detail. FIG. 5 is an enlarged plan view for showing the circumference of one of the suspension leads shown in FIG. 3 while enlarging the same. Further, FIG. 6 is an enlarged plan view for showing the circumference of an end-part lead shown in FIG. 5 while further enlarging the same.

As shown in FIG. 4, the semiconductor device PKG1 has a lead group LDg1 composed of a plurality of leads LD1 arranged along the side S1 of the sealing body MR. Further, the semiconductor device PKG1 has a lead group LDg2 composed of a plurality of leads LD2 arranged along the side S2 of the sealing body MR. Further, the semiconductor device PKG1 has a lead group LDg3 composed of a plurality of leads LD3 arranged along the side S3 of the sealing body MR. Further, the semiconductor device PKG1 has a lead group LDg4 composed of a plurality of leads LD4 arranged along the side S4 of the sealing body MR.

Further, each of the suspension leads HL (for supporting the die pad DP) coupled to the die pad DP is arranged between the lead group LDg1 and the lead group LDg2, between the lead group LDg1 and the lead group LDg4, between the lead group LDg2 and the lead group LDg3, and between the lead group LDg3 and the lead group LDg4.

Here, from the viewpoint of reducing the impedance components of a transmission route by reducing the length of each wire BW shown in FIG. 5, it is preferable to reduce the distance between a tip end part of each lead LD and the pad PD of the semiconductor chip CP by arranging the tip end part of each lead LD (see FIG. 2) near the pad PD of the semiconductor chip CP. Further, in the case of the semiconductor device having a number of terminals as in the embodiment, the tip end parts (bonding regions WBR shown in FIG. 2) of the leads LD are arranged at narrow pitches in narrow regions.

For example, in the example shown in FIG. 6, the width (the length in the direction orthogonal to the extending direction of each lead) BMW of each bonding region WBR is about 80 µm, and the interval BMP between the bonding regions WBR that are adjacent to each other is about 70 µm.

On the other hand, the pitches at which the outer lead parts OLD shown in FIG. 1 are arranged are restricted by the terminals on the mounting substrate (not shown) side on which the semiconductor device PKG1 is mounted, and thus it is difficult to extremely narrow the pitches. As a result, the extending distance of the inner lead part ILD included in each lead LD shown in FIG. 2 is increased.

As in the embodiment, in the case where the extending distance of each lead LD is long, a part of each lead LD is likely to be deformed in the manufacturing process of the semiconductor device. The deformation of the above-described leads LD includes, for example, reversible (elastic) deformation by the weight of the leads themselves in addition to irreversible plastic deformation. In particular, the tip end parts of the leads LD where the bonding regions WBR are provided are likely to be deformed (mainly, elastic deformation) as the lengths of the inner lead parts ILD become longer. In addition, when the bonding regions WBR are elastically deformed in a wire bonding process, it is difficult to join the wires BW.

Therefore, tape materials (tapes TP1, TP2, TP3, and TP4 shown in FIG. 3) are attached across the respective leads LD as shown in FIG. 3 to suppress the deformation of the leads LD in the embodiment.

The tapes TP1, TP2, TP3, and TP4 are fixing members for connecting and fixing the leads LD to each other, and, for example, an adhesive layer (a bonding layer) is formed on one surface (a bonding surface) of a base material such as a resin film. In addition, when the adhesive layer is brought into contact with one surface (for example, the upper surface LDt in the example shown in FIG. 2) of each lead LD, the tapes TP1, TP2, TP3, and TP4 are attached to the leads LD.

Further, if the leads LD are only connected to each other, the leads LD are possibly deformed by the entire weight of the connected leads LD. Therefore, a part of each of the tapes TP1, TP2, TP3, and TP4 is preferably attached to each suspension lead HL as shown in FIG. 4. As will be described later in detail, one end part of each suspension lead HL is coupled to the die pad DP, and the other end part is connected to the frame part of the lead frame in the wire bonding process of the manufacturing process of the semiconductor device PKG1. Therefore, if a part of each of the tapes TP1, TP2, TP3, and TP4 is attached to each suspension lead HL, the leads LD are supported by the suspension leads HL. As a result, the deformation of the leads LD can be suppressed.

Further, as shown in FIG. 5 and FIG. 6, in order to suppress the deformation near the bonding regions WBR, each of the tape TP1, tape TP2, tape TP3 (see FIG. 4), and tape TP4 (see FIG. 4) is preferably attached near the bonding regions WBR. For example, in the example shown in FIG. 4, a distance from each of the tape TP1, tape TP2, tape TP3, and tape TP4 to a wire joint part of each bonding region WBR (see FIG. 5) is about 1 mm. Namely, each of the tapes TP1, TP2, TP3, and TP4 is attached, at least, nearer the tip end part of each lead than an intermediate part located between the tip end part of each lead and the other end part (in this case, a part intersecting with each side of the sealing body MR.

Further, the holding strength of the wire connecting portion (the parts to which the wires BW are joined in the bonding regions WBR shown in FIG. 6) is changed in accordance with the distances between the tapes TP1, TP2, TP3, and TP4 and the wire connecting portion. Therefore, lengths LWT from the wire connecting portion of the bonding regions WBR included in the leads LD shown in FIG. 6 to the tapes TP1, TP2, TP3, and TP4 are preferably of nearly the same value. When the holding strength of the wire connecting portion is improved, the wires BW can be stably joined to the bonding regions WBR in the wire bonding process. As a result, the joint strength of the wires BW can be improved. It should be noted that the definition of the above-described "nearly the same value" will be described later.

Further, in order to reliably hold the leads LD, each of the leads LD needs to be attached to any one of the tapes TP1, TP2, TP3, and TP4. In the case where some of the leads LD are not attached to any one of the tapes TP1, TP2, TP3, and TP4, the leads LD are not held. Therefore, in the case where the tapes TP1, TP2, TP3, and TP4 divided as in the embodiment are attached to the leads LD, it is important to arrange the tapes TP1, TP2, TP3, and TP4 so as not to be overlapped with each other. If some of the tapes TP1, TP2, TP3, and TP4 are overlapped with each other, there is a possibility that a gap is generated between an attachment jig and the tape when the tape is attached, and some of the leads LD are not firmly attached to the tape.

It should be noted that in the case where the tape is formed in a frame shape without being divided into plural pieces and is attached so as to surround the circumferences of the bonding regions WBR (see FIG. 5) of the leads LD, there is a low possibility that some of the leads LD are not attached to the tapes, and the values of the lengths LWT shown in FIG. 6 can be nearly the same. However, if the acquisition efficiency in the tape manufacturing process is considered, it is preferable to divide the tape into plural members rather than to form the tape in a frame shape as described above.

Accordingly, the inventors of the application found the layout of the tapes of the embodiment in consideration of the above-described matters to be considered. Namely, as shown in FIG. 6, the semiconductor device PKG1 of the embodiment has the leads LD1, a suspension lead HL1 between the lead group LDg1 and the lead group LDg2, and the tape TP1 attached to, at least, some of the leads LD. Further, the semiconductor device PKG1 has the tape TP2 attached to each of the leads LD2. Further, the tape TP1 and the tape TP2 are attached to the same surface (the upper surface LDt in the example shown in FIG. 6) as each other, in the upper surface LDt and the lower surface LDb (see FIG. 2) of each lead LD.

Further, the tape TP1 has a lead holding part (a main part, a holding part, or a part) TP11 extended along the wire connecting portion (the parts to which the wires BW are joined in the bonding regions WBR) of the leads LD1 in plan view and is attached to each of the leads LD. Further, the tape TP1 has a tape supporting part (a supporting part or a part) TP12 attached to the suspension lead HL1 and the leads LD2 (some of the leads LD2) and is attached to a position farther from the wire connecting portion than the lead holding part TP11. Further, the tape TP1 has a connection part (a part) TP13 located between the lead holding part TP11 and the tape supporting part TP12. Further, the tape TP1 has no part overlapping with the tape TP2.

In other words, the tape TP1 of the embodiment has the tape supporting part TP12 and the connection part TP13 that bypass the intersection point of the extended line of the lead holding part TP11 and the suspension lead HL1 so as not to be overlapped with the tape TP2 near the suspension lead HL1.

The lead holding part TP11 is attached to the leads LD1, and has a function of holding the leads LD1. The lead holding part TP11 of the embodiment extends along the array direction of the wire connecting portion of the leads LD1. Specifically, as shown in FIG. 5, the lead holding part TP11 of the tape TP1 extends along a direction DRE1 up to a position intersecting with an end-part lead LDe1 located at an end part of the array in the leads LD1. Accordingly, the lengths LWT from the wire connecting portion of the bonding regions WBR included in the leads LD1 to the tape TP1 become nearly the same value.

The semiconductor device PKG1 has the end-part lead LDe1 arranged at a position nearest to the suspension lead HL1 provided between the lead group LDg1 and the lead group LDg2 among the leads LD1 included in the lead group LDg1. The lead holding part TP11 of the tape TP1 extends along the direction DRE1 that is the array direction of the wire connecting portion of the leads LD1, and a termination part (a boundary part between the lead holding part TP11 and the connection part TP13) of the lead holding part TP11 is attached to the end-part lead LDe1.

As described above, since the lead holding part TP11 extends along the direction DRE1 up to a position intersecting with the end-part lead LDe1, the lengths LWT from the wire connecting portion of the bonding regions WBR included in the leads LD1 to the tape TP1 become nearly the same value in the leads LD1.

The above-described "nearly the same value" includes a state in which all of the lengths LWT in the leads LD1 are exactly the same and a state in which some values of the lengths LWT are different. For example, it is difficult to accurately join the wires BW to the positions of the wire connecting portion according to design due to the effect of processing accuracy such as the accuracy of a bonding device. Therefore, as shown in FIG. 5, each of the metal films BM configuring the bonding regions WBR has a length LBM along the extending direction of the leads LD. The length LBM of each metal film BM is formed in such a manner that the wire connecting portion are positioned on the metal films BM even if the positions of the wire connecting portion are shifted. Thus, the length LBM of each metal film BM can be regarded as an index for an allowable range of the positional shift of the wire connecting portion. In the embodiment, the difference between the lengths LWT in the leads LD1 is smaller than the length LBM of each metal film BM. In the example shown in FIG. 5, the length LBM of each metal film is, for example, about 500 μm. Further, the length LWT in each lead LD1 is about, for example, about 1 mm.

Further, the following is another method of expression for showing that the lengths LWT from the wire connecting portion of the bonding regions WBR included in the leads LD1 to the tape TP1 are of nearly the same value. Namely, the length LWT from the wire joint part in the end-part lead LDe1 to the lead holding part TP11 of the tape TP1 is equal to the lengths LWT from the wire connecting portion in some of the leads LD1 other than the end-part lead LDe1 to the lead holding part TP11 of the tape TP1. For example, as shown in FIG. 5, the leads LD1 have non-end-part leads LDc1 other than the end-part lead LDe1 in addition to the end-part lead LDe1. In addition, the length LWT from the wire joint part in the end-part lead LDe1 to the lead holding part TP11 of the tape TP1 is equal to the lengths LWT from the wire connecting portion in the non-end-part leads LDc1 to the lead holding part TP11 of the tape TP1.

Likewise, the tape TP2 has a lead holding part (a main part, a holding part, or a part) TP21 extended along the wire connecting portion (the parts to which the wires BW are joined in the bonding regions WBR) of the leads LD2 in plan view and is attached to each of the leads LD2. A lead holding part TP21 extends along the array direction of the wire connecting portion of the leads LD2. Specifically, as shown in FIG. 5, the semiconductor device PKG1 has an end-part lead LDe2 arranged at a position nearest to the suspension lead HL1 provided between the lead group LDg1 and the lead group LDg2 among the leads LD2 included in the lead group LDg2. The lead holding part TP21 of the tape TP2 extends along a direction DRE2 that is the array direction of the wire connecting portion of the leads LD2, and a termination part (a boundary part between the lead holding part TP21 and a tape supporting part TP22) of the lead holding part TP21 is attached to the end-part lead LDe2. Accordingly, the lengths LWT from the wire connecting portion of the bonding regions WBR included in the leads LD2 to the tape TP2 become nearly the same value.

The definition of the above-described "nearly the same value" is the same as that of "nearly the same value" used in the comparison of the lengths LWT in the leads LD1. Namely, the difference between the lengths LWT from the wire connecting portion in the leads LD2 to the tape TP2 is smaller than the length LBM of each metal film BM in the embodiment.

Further, the length LWT from the wire joint part in the end-part lead LDe2 to the lead holding part TP21 of the tape TP2 is equal to the lengths LWT from the wire connecting portion in some of the leads LD2 other than the end-part lead LDe2 to the lead holding part TP21 of the tape TP2. For example, as shown in FIG. 5, the leads LD2 have non-end-part leads LDc2 other than the end-part lead LDe2 in addition to the end-part lead LDe2. In addition, the length LWT from the wire joint part in the end-part lead LDe2 to the lead holding part TP21 of the tape TP2 is equal to the lengths LWT from the wire connecting portion in the non-end-part leads LDc2 to the lead holding part TP21 of the tape TP2.

Further, the tape supporting part TP12 has a function of holding the lead holding part TP11 of the tape TP1 attached to the leads LD1. Therefore, the tape supporting part TP12 needs to be attached to, at least, the suspension lead HL1.

Further, the leads LD2 of the lead group LDg2 can be supported by attaching a part of the tape TP1 to the leads LD2. In the embodiment, as shown in FIG. 6, a part of the tape TP2 attached to the leads LD2 is attached to the suspension lead HL1. However, the supporting strength of the leads LD2 can be improved by attaching a part of the tape TP1 to the leads LD2. Further, as a modified example of FIG. 6, the tape TP2 may not be attached to the suspension lead HL1. In this case, the leads LD2 and the tape TP2 are supported by the suspension lead HL1 through the tape supporting part TP12 of the tape TP1.

In the examples shown in FIG. 5 and FIG. 6, the tape supporting part TP12 is attached to the leads LD2 including the end-part lead LDe2 arranged at (adjacent to the suspension lead HL1) the end part of the array of the lead group LDg2 among the leads LD2.

Further, from the viewpoint of improving the supporting strength of the tape supporting part TP12, there is a method of increasing the bonding area between the tape supporting part TP12 and the suspension lead HL1 by increasing the width of the suspension lead HL1. However, if the width of the suspension lead HL1 is increased, the number of leads LD that can be arranged is decreased. Accordingly, the tape supporting part TP12 is attached to the leads LD2 across the suspension lead HL1 in the width direction in the embodiment. In this case, even if the bonding interface between the suspension lead HL1 and the tape supporting part TP12 is separated, the tape TP1 can be supported because the tape supporting part TP12 is attached to not only the leads LD1 but also the leads LD2.

It should be noted that from the viewpoint of improving the supporting strength of the tape TP1 itself, it is only necessary to attach, at least, a part of the tape TP1 (for example, the lead holding part TP11 and the connection part TP13) to the leads LD1. Therefore, as a modified example of FIG. 5 and FIG. 6, the tape supporting part TP12 may not be attached to the end-part lead LDe1. However, from the viewpoint of preventing a fracture due to the stress concentrated on the boundary part between the tape supporting part TP12 and the connection part TP13, the boundary between the connection part TP13 and the tape supporting part TP12 is preferably attached to some of the leads LD1 (for example, the end-part lead LDe1 as shown in FIG. 5 and FIG. 6.

Further, as a method of increasing the bonding area between the tape supporting part TP12 and the suspension lead HL1, the following structure is preferable. Namely, in the example shown in FIG. 5, the width (the length in the Y direction orthogonal to the X direction that is the extending direction) of the tape supporting part TP12 of the tape TP1 is the same as the width (the length in the direction orthogonal to the direction DRE1 in which the lead holding part TP11 extends) of the lead holding part TP11, or larger than the width of the lead holding part TP11. According to the embodiment, since the tape supporting part TP12 is arranged at a position that has no part overlapping with the tape TP2, the width of the tape supporting part TP12 can be increased. In addition, the bonding area between the tape supporting part TP12 and the suspension lead HL1 can be increased by increasing the width of the tape supporting part TP12.

Further, in the example shown in FIG. 6, the tape supporting part TP12 of the tape TP1 and the suspension lead HL1 intersect with each other at an angle other than 90 degrees. Accordingly, the bonding area between the tape supporting part TP12 and the suspension lead HL1 can be increased as compared to a case in which the extending direction of the tape supporting part TP12 is orthogonal to the extending direction of the suspension lead HL1.

Further, as shown in FIG. 5, the lengths LWT from the wire connecting portion of the bonding regions WBR included in the leads LD1 to the tape TP1 are nearly the same as the lengths LWT from the wire connecting portion of the bonding regions WBR included in the leads LD2 to the tape TP2 in the embodiment.

In the embodiment, the difference between the lengths LWT in the leads LD1 and the leads LD2 is smaller than the length LBM of each metal film BM. For example, the difference between the length LWT from the wire joint part in the end-part lead LDe1 to the lead holding part TP11 of the tape TP1 and the length LWT from the wire joint part in the end-part lead LDe2 to the lead holding part TP21 of the tape TP2 is smaller than the length LBM of each metal film BM.

Further, the length LWT from the wire joint part in the end-part lead LDe1 among the leads LD1 to the lead holding part TP11 of the tape TP1 is equal to the lengths LWT from the wire connecting portion in the non-end-part leads LDc2 among the leads LD2 to the lead holding part TP21 of the tape TP2.

Further, the length LWT from the wire joint part in the end-part lead LDe2 among the leads LD2 to the lead holding part TP21 of the tape TP2 is equal to the lengths LWT from the wire connecting portion in the non-end-part leads LDc1 among the leads LD1 to the lead holding part TP11 of the tape TP1.

As described above, if the lengths LWT in the lead group LDg1 and the lead group LDg2 are of nearly the same value, the holding strength of the bonding regions WBR by the tape TP1 can be substantially equal to the holding strength of the bonding regions WBR by the tape TP2.

By the way, in the case where the lengths LWT in the lead group LDg1 and the lead group LDg2 are of nearly the same value, when the extending distances of the lead holding part TP11 and the lead holding part TP21 are too long, an overlapped part is generated. For example, in the example shown in FIG. 5, the extended line of the lead holding part TP11 of the tape TP1 intersects with the extended line of the lead holding part TP21 of the tape TP2 at a position overlapped with the suspension lead HL1 in plan view. Further, the tape supporting part TP22 of the tape TP2 is arranged on the extended line of the lead holding part TP11 of the tape TP1 in plan view. Further, the connection part TP13 of the tape TP1 is arranged on the extended line of the lead holding part TP21 of the tape TP2 in plan view.

As described above, in the case where the tape TP1 and the tape TP2 are partially overlapped with each other, there is a possibility that a gap is generated between a jig for attaching the tape TP1 and the tape TP2 and the tape, and some of the leads LD are not firmly attached to the tape. Accordingly, a bent part is provided in the tape TP1 to prevent the tape TP1 and the tape TP2 from being overlapped with each other in the embodiment.

Specifically, the tape supporting part TP12 of the tape TP1 is attached to a position farther from the wire connecting portion than the lead holding part TP11. In the example shown in FIG. 6, the distances from the tape supporting part TP12 to the metal films BM configuring the bonding regions WBR are larger than the distances from the lead holding part TP11 to the metal films BM. Further, the distance from the tape supporting part TP12 to the die pad DP is larger than the distance from the lead holding part TP11 to the die pad DP.

On the other hand, the distances from the lead holding part TP21 of the tape TP2 to the wire connecting portion included in the leads LD2 are nearly equal to the distances from the lead holding part TP11 of the tape TP1 to the wire connecting portion included in the leads LD1. Further, the distances from the lead holding part TP21 of the tape TP2 to the metal films BM configuring the bonding regions WBR included in the leads LD2 are nearly equal to the distances from the lead holding part TP11 of the tape TP1 to the metal films BM included in the leads LD1. Further, the distance from the lead holding part TP21 of the tape TP2 to the die pad DP is nearly equal to the distance from the lead holding part TP11 of the tape TP1 to the die pad DP.

Thus, even if the tape supporting part TP12 is attached to the leads LD2, the tape TP1 and the tape TP2 are arranged while being not overlapped with each other. Therefore, according to the embodiment, each of the leads LD1 is reliably attached to the tape TP1, and each of the leads LD2 is reliably attached to the tape TP2.

Further, the connection part TP13 has a function of connecting the lead holding part TP11 to the tape supporting part TP12 to transmit the supporting force of the tape supporting part TP12 to the lead holding part TP11. It should be noted that the connection part TP13 extends so as to linearly connect the lead holding part TP11 and the tape supporting part TP12 to each other in the example shown in FIG. 6. In this case, the distance of the connection part TP13 is shortened, and thus the connection part TP13 is hardly fractured. However, in order to transmit the supporting force of the tape supporting part TP12 to the lead holding part TP11, it is only necessary to connect the lead holding part TP11 and the tape supporting part TP12 to each other. Therefore, as a comparative example of the embodiment, the lead holding part TP11 and the tape supporting part TP12 may be connected to each other through a plurality of parts including the connection part TP13.

Further, from the viewpoint of increasing the number of terminals by narrowing the gaps between the suspension lead HL1 and the leads LD1, the following configuration is preferable. Namely, in the example shown in FIG. 6, the connection part TP13 of the tape TP1 is attached to the end-part lead LDe1. In other words, the lead holding part TP11 does not extend up to the position of the suspension lead HL1, but is coupled to the connection part TP13 at a position overlapped with the end-part lead LDe1. As described above, since the lead holding part TP11 is terminated at a position overlapped with the end-part lead LDe1, the distance between the suspension lead HL1 and the leads LD1 (specifically, the end-part lead LDe1) can be shortened. Accordingly, since the density of arrangement of the leads LD can be improved, the number of external terminals included in the semiconductor device PKG1 can be increased.

Further, as shown in FIG. 4, the tape TP1 and the tape TP2 are separated from each other. In other words, the tape TP1 and the tape TP2 are arranged in a state where the tape TP1 and the tape TP2 are apart from each other. It should be noted that if the tape TP1 and the tape TP2 are not overlapped with each other, there is a possibility that some of the leads LD are not firmly attached to the tape as described above. However, for example, if there is no overlapped part between the tape TP1 and the tape TP2 even though the end part of the tape TP1 is brought into contact with the end part of the tape TP2, each of the leads LD can be firmly attached to the tapes TP1 and TP2. However, in the case where the end part of the tape TP1 is brought into contact with the end part of the tape TP2, there is concern that the tape TP1 and the tape TP2 are overlapped with each other. Thus, the tape TP1 and the tape TP2 are preferably separated from each other as in the embodiment.

Further, the tape TP1 and the tape TP2 are different in shape from each other in the embodiment. Namely, as shown in FIG. 5, the tape TP2 has the lead holding part (a main part, a holding part, or a part) TP21 extended along the wire connecting portion (the parts to which the wires BW are joined in the bonding regions WBR) of the leads LD2 in plan view and is attached to each of the leads LD. Further, the tape TP2 has the tape supporting part TP22 attached to the suspension lead HL1 arranged between the lead group LDg1 and the lead group LDg2 and extends along the extending direction of the connection part TP13 of the tape TP1.

As described above, the supporting strength of the tape TP2 can be improved by attaching a part of the tape TP2 to the suspension lead HL1. Further, since the tape supporting part TP22 extends along the connection part TP13 of the tape TP1, the tape TP1 and the tape TP2 can be prevented from being overlapped with each other.

Further, as shown in FIG. 5, the lead holding part TP21 of the tape TP2 is coupled to the tape supporting part TP22 at a position overlapped with the end-part lead LDe2. In other words, the tape TP2 has the bent part at the position overlapped with the end-part lead LDe2. In addition, the tape TP2 is not brought into contact with the leads LD1. As described above, if the tape TP2 and the leads LD1 are not brought into contact with each other, the tape TP1 and the tape TP2 can be prevented from being overlapped with each other.

Figure 7:
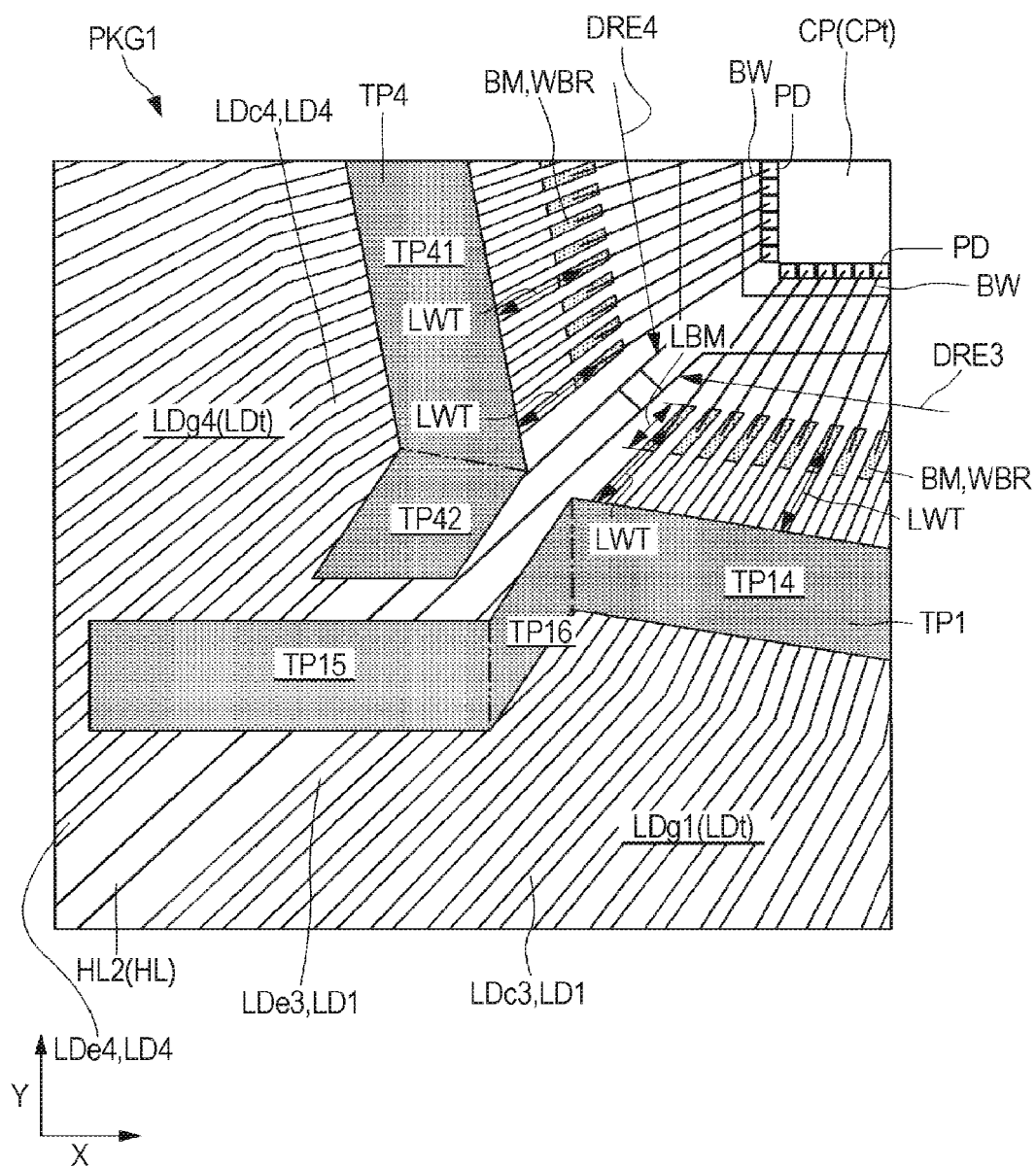
FIG. 7 is an enlarged plan view for showing the circumference of an end part on the opposite side of a tape shown in FIG. 5 while enlarging the same.

Further, as shown in FIG. 4, the tape TP1 included in the semiconductor device PKG1 of the embodiment has a structure symmetrical with respect to the center line that is a line (a virtual line (not shown)) connecting the center of the side S1 of the sealing body MR to the center of the side S3. FIG. 7 is an enlarged plan view for showing the circumference of an end part on the opposite side of the tape shown in FIG. 5 while enlarging the same.

As shown in FIG. 7, a part of the tape TP1 is attached to the suspension lead HL2 arranged between the lead group LDg4 and the lead group LDg1 and some of the leads LD4 at the end part on the opposite side of the tape supporting part TP12 (see FIG. 5).

Specifically, the tape TP1 has a lead holding part (a main part, a holding part, or a part) TP14 that extends along the wire connecting portion (the parts to which the wires BW are joined in the bonding regions WBR) of the leads LD1 in plan view and is attached to each of the leads LD1. Further, the tape TP1 has a tape supporting part (a supporting part or a part) TP15 attached to the suspension lead HL2 and the leads LD4 (some of the leads LD4) and is attached to a position farther from the wire connecting portion than the lead holding part TP14. Further, the tape TP1 has a connection part (a part) TP16 located between the lead holding part TP14 and the tape supporting part TP15.

Specifically, as shown in FIG. 7, the semiconductor device PKG1 has an end-part lead LDe3 arranged at a position nearest to the suspension lead HL2 provided between the lead group LDg1 and the lead group LDg4 among the leads LD1 included in the lead group LDg1. The lead holding part TP14 of the tape TP1 extends along a direction DRE3 that is the array direction of the wire connecting portion of the leads LD1, and a termination part (a boundary part between the lead holding part TP14 and the connection part TP16) of the lead holding part TP14 is attached to the end-part lead LDe3. Accordingly, the lengths LWT from the wire connecting portion of the bonding regions WBR included in the leads LD1 to the tape TP1 become nearly the same value.

Further, the semiconductor device PKG1 has the tape TP4 attached to each of the leads LD4. In plan view, the tape TP4 has a lead holding part (a main part, a holding part, or a part) TP41 extended along the wire connecting portion of the leads LD4 and is attached to each of the leads LD4. The lead holding part TP41 extends along the array direction of the wire connecting portion of the leads LD4.

Specifically, as shown in FIG. 7, the semiconductor device PKG1 has an end-part lead LDe4 arranged at a position nearest to the suspension lead HL2 provided between the lead group LDg1 and the lead group LDg4 among the leads LD4 included in the lead group LDg4. The lead holding part TP41 of the tape TP4 extends along a direction DRE4 that is the array direction of the wire connecting portion of the leads LD4, and a termination part (a boundary part between the lead holding part TP41 and the tape supporting part 42) of the lead holding part TP41 is attached to the end-part lead LDe4. Accordingly, the lengths LWT from the wire connecting portion of the bonding regions WBR included in the leads LD4 to the tape TP4 become nearly the same value.

Further, the tape TP1 and the tape TP4 are not overlapped with each other. Further, the tape TP1 and the tape TP4 are attached to the same surface (the upper surface LDt in the example shown in FIG. 7) of the upper surface LDt and the lower surface LDb (see FIG. 2) of each lead LD.

It should be noted that the direction DRE2 that is the array direction of the wire connecting portion of the leads LD1 shown in FIG. 5 and the direction DRE3 that is the array direction of the wire connecting portion of the leads LD1 shown in FIG. 7 are not parallel to the side S4 shown in FIG. 4 in the embodiment. In other words, the direction DRE1 shown in FIG. 5 and the direction DRE3 shown in FIG. 7 obliquely extend relative to the side S4 shown in FIG. 4. Further, the direction DRE1 shown in FIG. 5 and the direction DRE3 shown in FIG. 7 are not parallel to each other. This is because the lengths of the wires BW that couple the pads PD of the semiconductor chip CP and the leads LD1 to each other are equalized.

Therefore, the lead holding part TP11 shown in FIG. 5 and the lead holding part TP14 shown in FIG. 7 have been described above while dividing the configuration part of the tape TP1 in each array direction of the wire connecting portion. However, the lead holding part TP11 and the lead holding part TP14 are coupled to each other, and have the same function (the function of holding the leads LD1 by being attached to the leads LD1). Therefore, the lead holding part TP11 and the lead holding part TP14 may be regarded as one configuration part.

Further, as described above, the tape TP1 has a structure symmetrical with respect to the center line that is a line (a virtual line (not shown)) connecting the center of the side S1 of the sealing body MR to the center of the side S3. Further, the tape TP4 has a structure symmetrical with respect to the center line that is a line (a virtual line (not shown)) connecting the center of the side S2 of the sealing body MR to the center of the side S4. Thus, in the description using FIG. 5 and FIG. 6, the lead holding part TP11, the tape supporting part TP12, the connection part TP13, the end-part lead LDe1, and the non-end-part leads LDc1 can be replaced by the lead holding part TP14, the tape supporting part TP15, the connection part TP16, the end-part lead LDe3, and the non-end-part leads LDc3, respectively. Further, in the description using FIG. 5 and FIG. 6, the tape TP2, the lead holding part TP21, the tape supporting part TP22, the end-part lead LDe2, and the non-end-part leads LDc2 can be replaced by the tape TP4, the lead holding part TP41, the tape supporting part TP42, the end-part lead LDe4, and the non-end-part leads LDc4, respectively. Likewise, in the description using FIG. 5 and FIG. 6, the suspension lead HL1 can be replaced by the suspension lead HL2.

Further, although duplicated explanation will be omitted, each of the tape TP2 and the tape TP4 shown in FIG. 4 has a structure symmetrical with respect to the center line that is a line (a virtual line (not shown)) connecting the center of the side S2 of the sealing body MR to the center of the side S4. Further, each of the tape TP3 and the tape TP1 shown in FIG. 4 has a structure symmetrical with respect to the center line that is a line (a virtual line (not shown)) connecting the center of the side S2 of the sealing body MR to the center of the side S4. Thus, in the description using FIG. 5 and FIG. 6, the tape TP1 can be replaced by the tape TP3 shown in FIG. 4.

<Manufacturing Method of Semiconductor Device>

Figure 8:
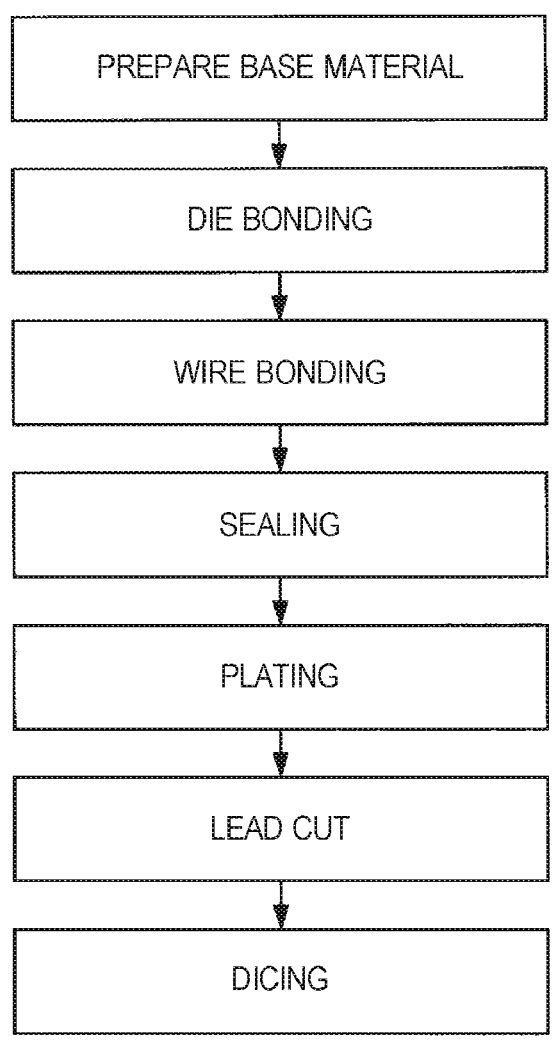
FIG. 8 is an explanatory view for showing a flow of assembly processes of the semiconductor device described using FIG. 1 to FIG. 7.

Next, a manufacturing method of the semiconductor device PKG1 described using FIG. 1 to FIG. 7 will be described using a flowchart shown in FIG. 8. FIG. 8 is an explanatory view for showing a flow of assembly processes of the semiconductor device described using FIG. 1 to FIG. 7.

Further, FIG. 8 shows main processes among the manufacturing processes of the semiconductor device PKG1, but various modified examples can be applied other than the assembly flow shown in FIG. 8. For example, a marking process in which a product identification mark is formed in the sealing body MR is not illustrated in FIG. 8, but can be added between a sealing process and a plating process. Further, for example, an inspection process is not illustrated in FIG. 8, but may be added after, for example, a dicing process.

<Base Material Preparation Process>

Figure 9:
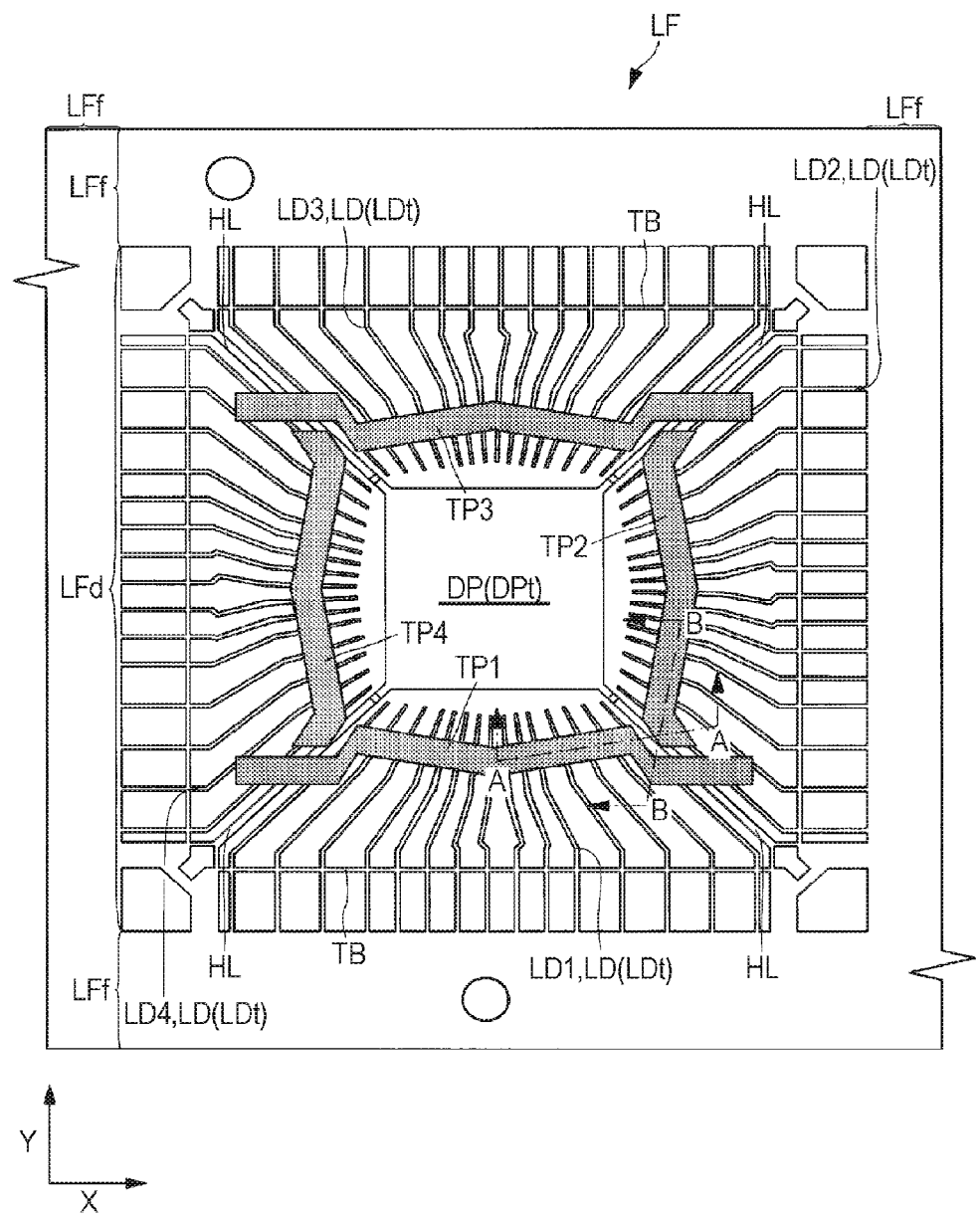
FIG. 9 is an enlarged plan view for showing a lead frame prepared in a base material preparation process shown in FIG. 8.
Figure 10:
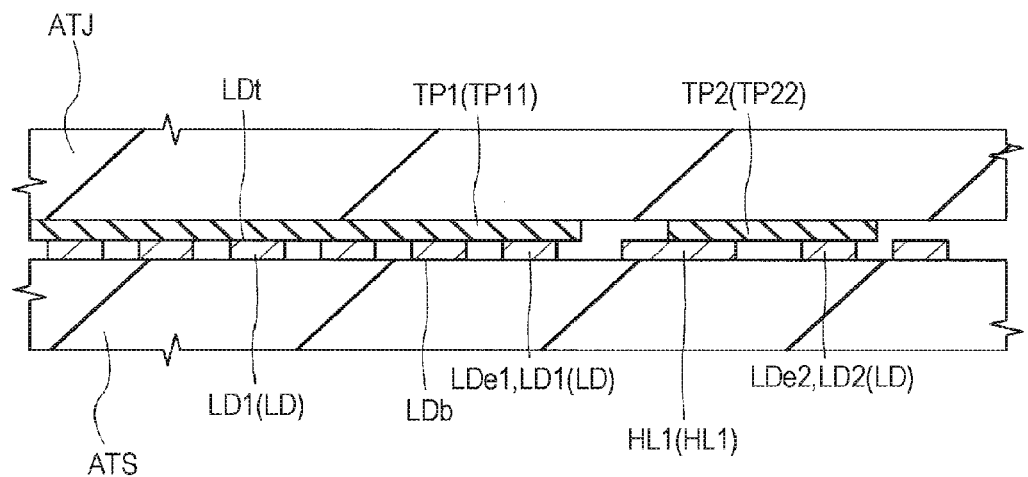
FIG. 10 is an enlarged cross-sectional view for showing a state in which a tape is attached to a plurality of leads in a cross section along the line A-A of FIG. 9.
Figure 11:
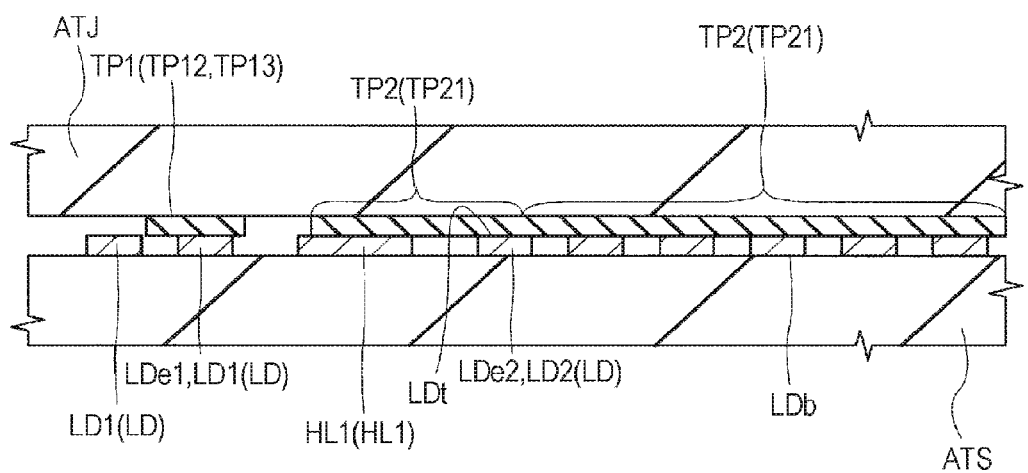
FIG. 11 is an enlarged cross-sectional view for showing a state in which the tape is attached to the leads in a cross section along the line B-B of FIG. 9.

In a base material preparation process shown in FIG. 8, a lead frame LF shown in FIG. 9 is prepared. FIG. 9 is an enlarged plan view for showing the lead frame prepared in the base material preparation process shown in FIG. 8. Further, FIG. 10 is an enlarged cross-sectional view for showing a state in which the tape is attached to the leads in a cross section along the line A-A of FIG. 9. Further, FIG. 11 is an enlarged cross-sectional view for showing a state in which the tape is attached to the leads in a cross section along the line B-B of FIG. 9.

It should be noted that the lead frame LF is a base material including a plurality of device formation parts LFd. However, FIG. 9 shows one of the device formation parts LFd while enlarging the same for easily viewing the drawing. Further, FIG. 9 does not illustrate some of the leads LD shown in FIG. 3 for easily viewing the drawing. Hereinafter, the same applies to enlarged plan views for explaining a manufacturing method of the semiconductor device PKG1.

The lead frame LF prepared in the process includes the device formation parts LFd inside a frame part LFf. The lead frame LF is made of metal, and is made of metal composed mainly of, for example, copper (Cu) in the embodiment.

It should be noted that an example in which the plating process is performed after the sealing process as shown in FIG. 8 and the metal film MC shown in FIG. 2 is formed at the outer lead parts OLD will be described in the embodiment. However, as a modified example, the surface of the base material composed mainly of copper may be covered with the metal film MC in advance in the stage of the base material preparation process. In this case, the entire exposed surface of the lead frame LF is covered with the metal film MC.

Further, the die pad DP that is a chip mounting part is formed in the middle of each device formation part LFd as shown in FIG. 9. The suspension leads HL are connected to the die pad DP, and are arranged so as to extend towards the corner parts of the device formation parts LFd. Namely, the die pad DP is supported by the suspension leads HL, and is supported by the frame part LFf of the lead frame LF through the suspension leads HL.

Further, the leads LD are formed between the suspension leads HL around the die pad DP. The respective leads LD are connected to the frame part LFf. In the example shown in FIG. 9, the leads LD include the leads LD1 arranged along the X direction and the leads LD2 arranged along the Y direction intersecting with (orthogonal to) the X direction. Further, the leads LD include the leads LD3 arranged along the X direction on the opposite side of the leads LD1 and the leads LD4 arranged along the Y direction on the opposite side of the leads LD2.

Further, the leads LD are connected to each other through a tie bar TB. The tie bar TB has a function as a dam member for suppressing a leakage of resin in the sealing process shown in FIG. 8 in addition to a function as a connecting member for connecting the leads LD. The tie bar TB is coupled to the leads LD and the frame part LFf of the lead frame LF. Further, one end part of each lead LD is coupled to the frame part LFf of the lead frame LF. Therefore, the respective leads LD are supported by the frame part LFf of the lead frame LF before a lead cut process shown in FIG. 8.

However, as described above, the extending distances of the inner lead parts ILD (see FIG. 2) of the leads LD in the embodiment are long. Therefore, in order to prevent the deformation of the other end part (the end part not coupled to the frame part LFf) of each lead LD, the above-described tapes TP1, TP2, TP3, and TP4 are attached.

Accordingly, for example, a process of attaching the tapes TP1, TP2, TP3, and TP4 to the leads LD formed at the lead frame LF is performed as follows. Namely, as shown in FIG. 10 and FIG. 11, the tape TP1 and the tape TP2 are arranged on one surface (the upper surface LDt side in the examples shown in FIG. 10 and FIG. 11) of each lead LD in a state where the leads LD are arranged on a stage (an attachment stage) ATS. In addition, the tapes TP1 and TP2 are pressed against the leads LD while pressing a jig (an attachment jig) ATJ from the upper surface sides of the tape TP1 and the tape TP2. Accordingly, the tape TP1 and the tape TP2 are attached to the leads LD. In this case, in the case where the tape TP1 and the tape TP2 are overlapped with each other, the separated distance between the stage ATS and the jig ATJ is defined by the thickness of the overlapped part. Therefore, a gap is generated between the jig ATJ or the stage ATS and the tapes TP1 and TP2 at a part where the tape TP1 has no part overlapping with the tape TP2. As a result, there is concern that the pressing force applied from the jig ATJ is not transmitted to a part of the tapes TP1 and TP2, and both of the tape TP1 and the tape TP2 are not bonded to some of the leads LD.

However, as shown in FIG. 9 to FIG. 11, the tapes TP1, TP2, TP3 (see FIG. 9), and TP4 (see FIG. 9) are not overlapped with each other according to the embodiment. Thus, the respective leads LD are reliably bonded to, at least, any one of the tapes TP1, TP2, TP3, and TP4.

It should be noted that each of FIG. 10 and FIG. 11 shows an example of attaching the tape TP1 and the tape TP2 at a time, but the tape TP1 and the tape TP2 may be attached in order. Even in this case, since the tape TP1 and the tape TP2 are not overlapped with each other, the respective leads LD1 are attached to the tape TP1, and the respective leads LD2 are attached to the tape TP2. Further, the attaching method of the tape TP3 and the tape TP4 shown in FIG. 9 is the same.

<Die Bonding Process>

Figure 12:
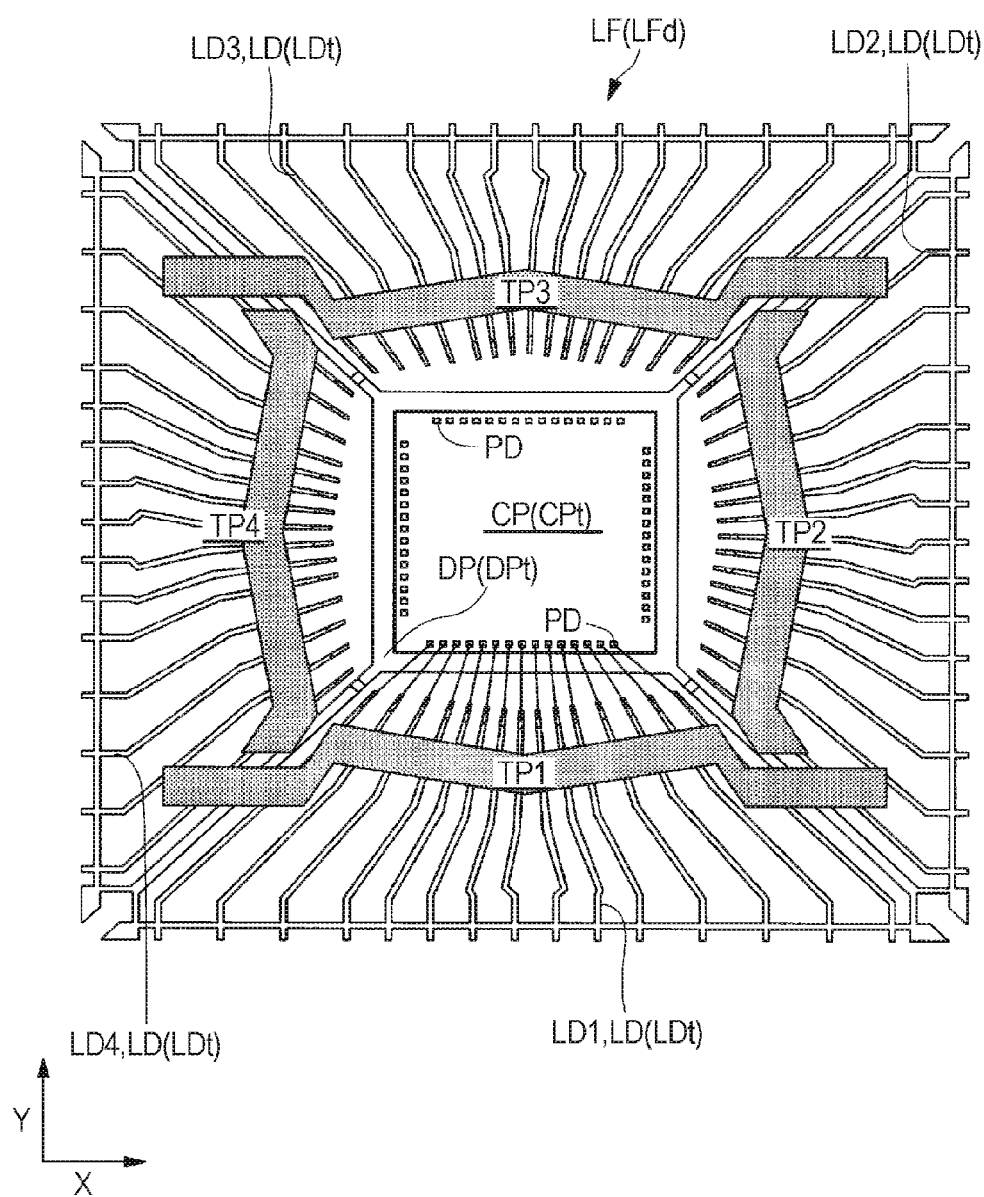
FIG. 12 is an enlarged plan view for showing a state in which the semiconductor chip is mounted on a die pad of the lead frame shown in FIG. 9.

Next, in a die bonding process (a semiconductor chip mounting process) shown in FIG. 8, the semiconductor chip CP is mounted on the die pad DP as shown in FIG. 12. FIG. 12 is an enlarged plan view for showing a state in which the semiconductor chip is mounted on the die pad of the lead frame shown in FIG. 9.

As described using FIG. 2, the semiconductor chip CP has the top surface CPt on which the pads PD are formed and the back surface CPb opposite to the top surface CPt. In this process, the semiconductor chip CP and the die pad DP are bonded and fixed to each other through the die bond material DB (see FIG. 2) that is an adhesive made of, for example, thermosetting resin such as epoxy resin. In the example shown in FIG. 12, the semiconductor chip CP is mounted so that a part of the upper surface DPt of the die pad DP is covered with the semiconductor chip CP in plan view.

Further, as described using FIG. 2, the semiconductor chip CP is mounted on the die pad DP by a so-called face-up mounting method in the example of the embodiment so that the back surface CPb faces the upper surface DPt that is a chip mounting surface of the die pad DP.

<Wire Bonding Process>

Figure 13:
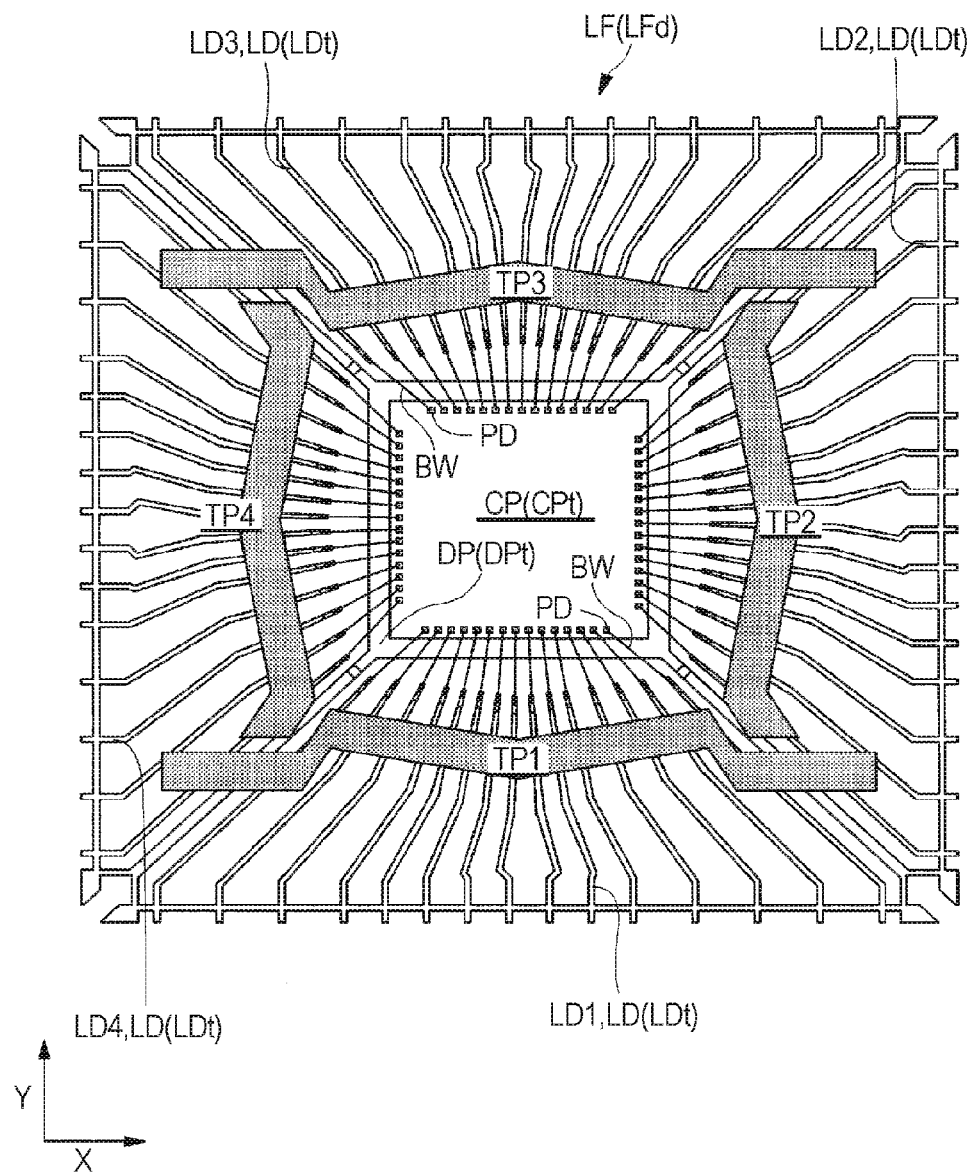
FIG. 13 is an enlarged plan view for showing a state in which the semiconductor chip and the leads shown in FIG. 12 are electrically coupled to each other through wires.

Next, in a wire bonding process shown in FIG. 8, the pads PD formed on the top surface CPt of the semiconductor chip CP are electrically coupled to the leads LD arranged around the semiconductor chip CP through the wires (conductive members) BW as shown in FIG. 13. FIG. 13 is an enlarged plan view for showing a state in which the semiconductor chip and the leads shown in FIG. 12 are electrically coupled to each other through the wires. Further, FIG. 14 is an enlarged cross-sectional view for showing a state in which the pads of the semiconductor chip and the leads shown in FIG. 13 are electrically coupled to each other through the wires.

Figure 14:
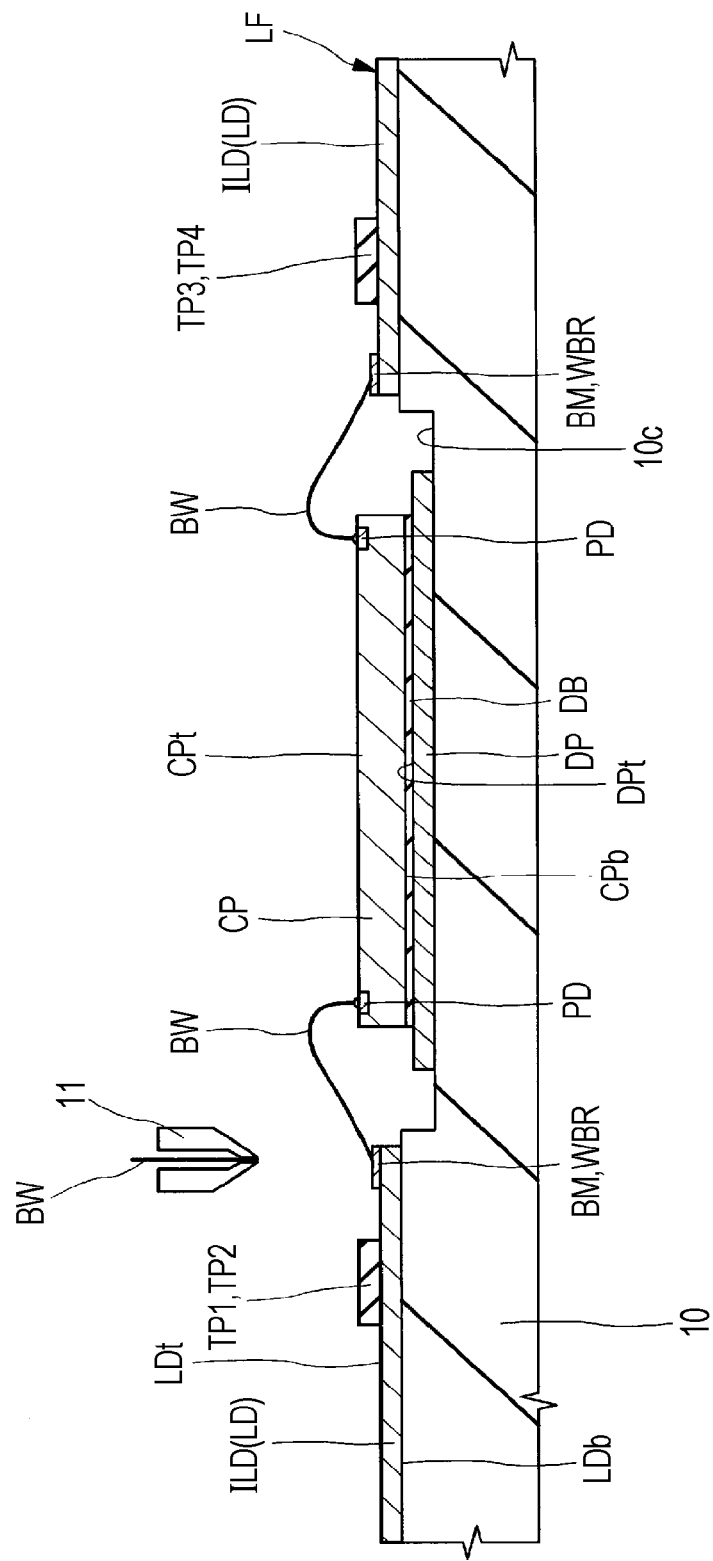
FIG. 14 is an enlarged cross-sectional view for showing a state in which the pads of the semiconductor chip and the leads shown in FIG. 13 are electrically coupled to each other through the wires.

In the process, a heat stage 10 in which a concave part 10c is formed is prepared as shown in, for example, FIG. 14, and the lead frame LF on which the semiconductor chip CP is mounted is arranged on the heat stage 10 so that the die pads DP are located in the concave part 10c. In addition, the pads PD of the semiconductor chip CP and the leads LD are electrically coupled to each other through the wires BW. In this case, the wires BW are joined by a so-called nail head bonding method in which the wires BW are supplied through a capillary 11 and both of ultrasonic waves and thermocompression are used in the embodiment. Further, the wires BW are joined by a so-called normal bonding method in which one end part of each wire BW is coupled to the pads PD of the semiconductor chip CP, and then the other end part of each wire BW is coupled to the bonding regions WBR of the leads LD in the embodiment. In the example shown in FIG. 14, the other end part of each wire BW is joined to the metal film BM formed on the upper surface LDt of each lead LD. The parts to which the wires BW are joined correspond to the above-described wire connecting portion.

Further, the leads LD are heated through the heat stage 10 in the process. Therefore, the tapes TP1, TP2, TP3, and TP4 attached to the leads LD preferably suppress the firm attachment of the heat stage 10 and the leads LD from being inhibited. Accordingly, of the upper surface LDt and the lower surface LDb of each lead LD, the tapes TP1, TP2, TP3, and TP4 are preferably attached to the surface to which the wires BW are joined. In the case of the embodiment, the wires BW are joined on the upper surface LDt side of the leads LD. Therefore, each of the tapes TP1, TP2, TP3, and TP4 is attached to the upper surface LDt of each lead LD. Accordingly, the heat stage 10 and the leads LD can be firmly attached to each other.

Further, according to the embodiment, the respective leads LD are held by the tapes TP1, TP2, TP3, and TP4. Therefore, the deformation of some of the leads LD can be suppressed in the wire bonding process. As a result, the wires BW can be reliably joined to the respective bonding regions WBR of the leads LD.

<Sealing Process>

Figure 15:
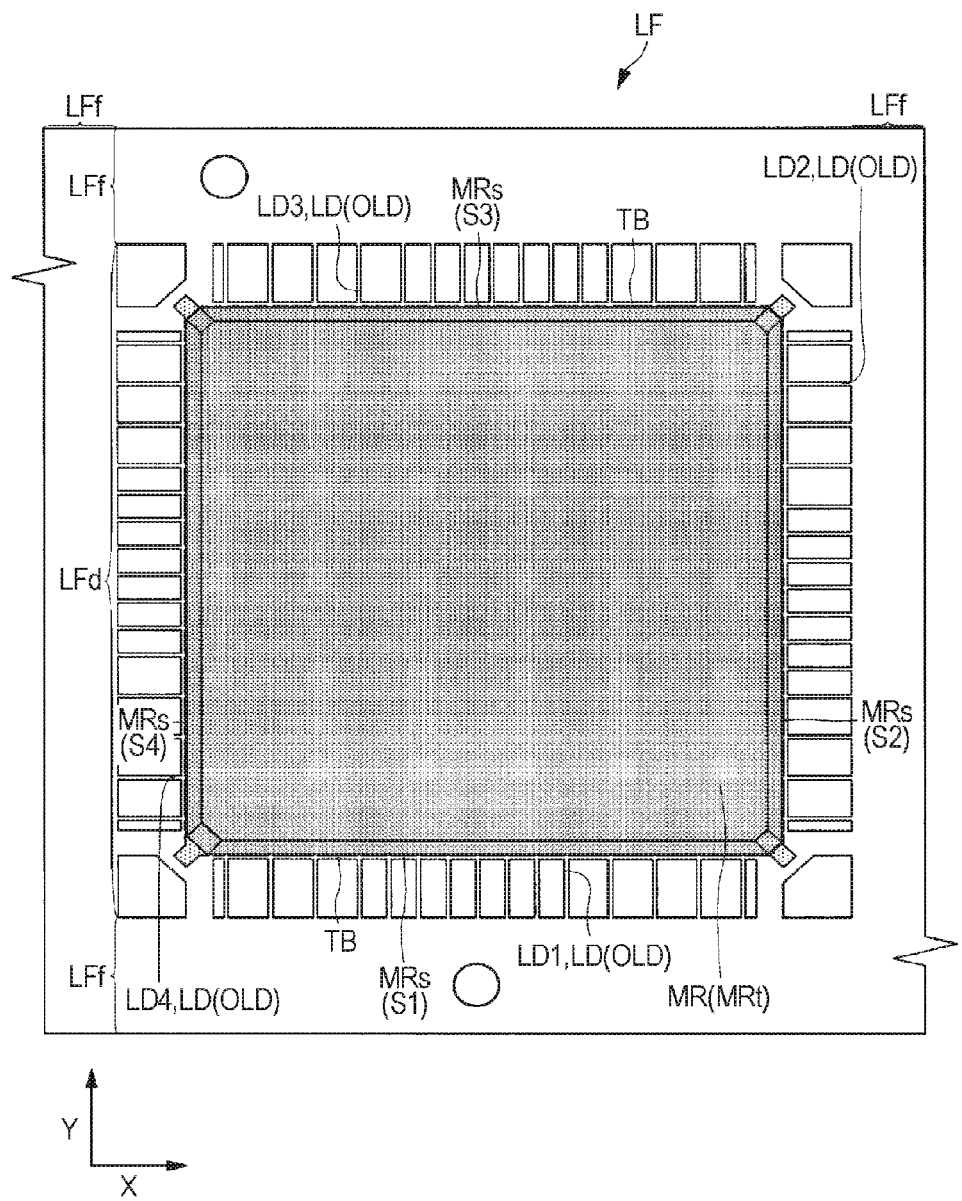
FIG. 15 is an enlarged plan view for showing a state in which the sealing body for sealing the semiconductor chip is formed in each of a plurality of device formation parts shown in FIG. 13.

Next, in a sealing process shown in FIG. 8, the semiconductor chip CP, the wires BW, and the inner lead parts ILD of the leads LD shown in FIG. 13 are sealed with resin to form the sealing body MR shown in FIG. 15. FIG. 15 is an enlarged plan view for showing a state in which the sealing body for sealing the semiconductor chip is formed in each of the device formation parts shown in FIG. 13.

In the process, for example, in a state where the lead frame LF is arranged in a molding die having a plurality of cavities (not shown), resin is supplied into a space formed by the cavities, and then the resin is hardened to form the sealing body (sealing part) MR. Such a method of forming the sealing body MR is referred to as a transfer mold method.

In the example shown in FIG. 15, the cavities of the molding die are arranged in a region surrounded by the tie bar TB of the device formation parts LFd in plan view. Therefore, the body part of the sealing body MR is formed in a region surrounded by the tie bar TB of the device formation parts LFd as shown in FIG. 15. Further, a part of resin leaked from the cavities is dammed by the tie bar TB. Therefore, the respective outer lead parts OLD included in the leads LD are exposed from the side surface MRs of the sealing body MR.

Among the leads LD, the outer lead parts OLD of the leads LD1 extending along the Y direction protrude from the side surface MRs of the sealing body MR in the side S1 of the sealing body MR. Further, among the leads LD, the outer lead parts OLD of the leads LD2 extending along the X direction protrude from the side surface MRs of the sealing body MR in the side S2 of the sealing body MR. Further, among the leads LD, the outer lead parts OLD of the leads LD3 extending along the Y direction protrude from the side surface MRs of the sealing body MR in the side S3 of the sealing body MR. Further, among the leads LD, the outer lead parts OLD of the leads LD4 extending along the X direction protrude from the side surface MRs of the sealing body MR in the side S4 of the sealing body MR.

<Plating Process>

Next, in a plating process shown in FIG. 8, the metal film MC (see FIG. 2) is formed on the exposed surfaces of the leads LD shown in FIG. 15 by a plating method. The metal film MC formed in the process is formed to improve the wettability of a solder material used as a joint material when the semiconductor device PKG1 is mounted on amounting substrate (not shown).

In the process, it is preferable to form the metal film MC made of solder on the exposed surfaces of the leads LD. Further, as a method of forming the metal film MC, an electroplating method in which ionized metal ions are deposited on the exposed surfaces of the leads LD can be applied. The electroplating method is preferable because the film quality of the metal film MC can be easily controlled by controlling the current when the metal film MC is formed. Further, an electrolytic plating method is preferable because the metal film MC can be formed in a short time.

<Lead Cut Process>

Figure 16:
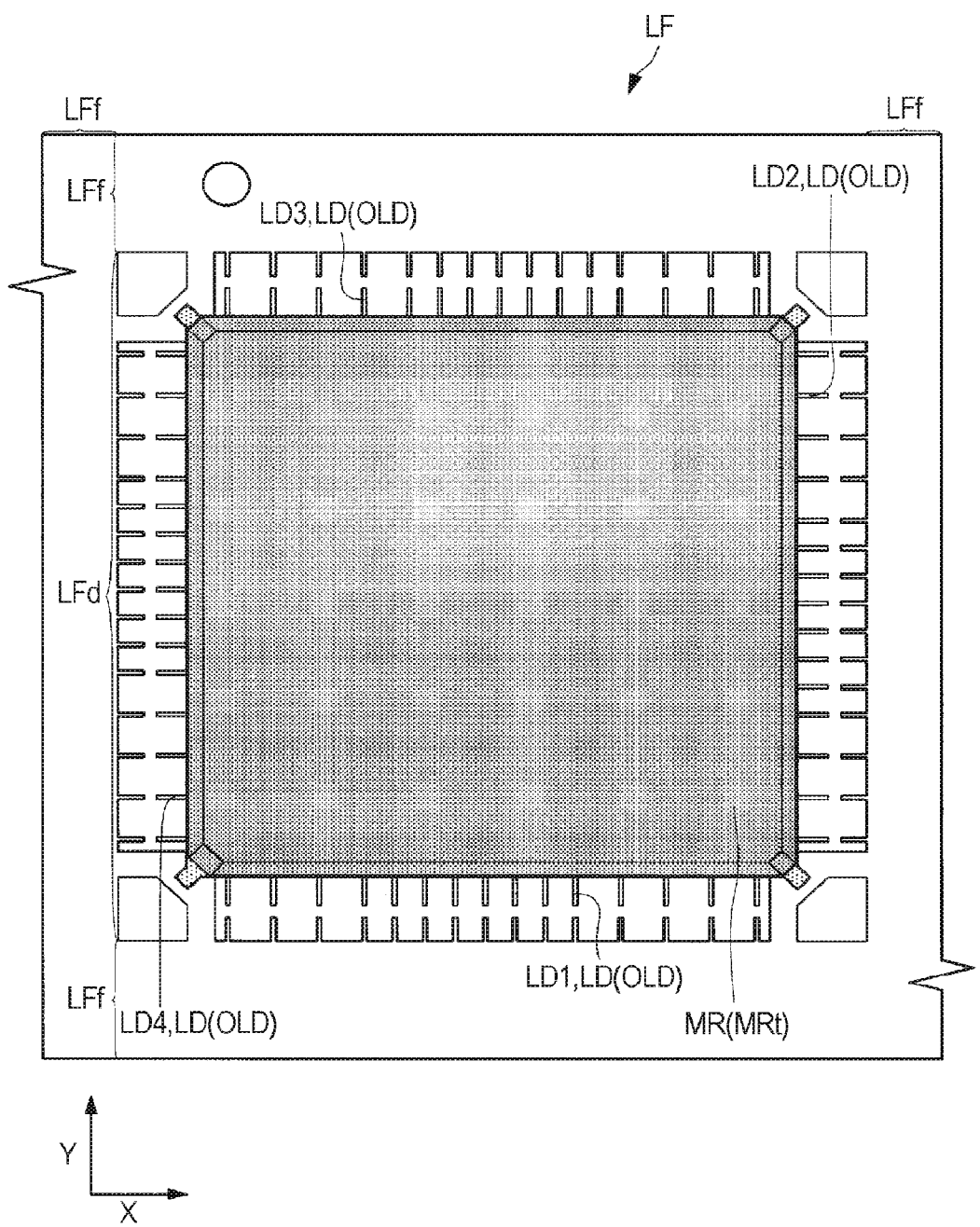
FIG. 16 is an enlarged plan view for showing a state in which a metal film is formed on the exposed surfaces of the leads shown in FIG. 15 and is cut followed by molding.

Next, in a lead cut process shown in FIG. 8, the respective outer lead parts OLD of the leads LD are cut as shown in FIG. 16, and the leads LD are separated from the lead frame LF. Further, after cutting the leads LD, bending work as shown in FIG. 2 is performed to mold the leads LD in the embodiment. FIG. 16 is an enlarged plan view for showing a state in which the metal film is formed on the exposed surfaces of the leads shown in FIG. 15 and is cut followed by molding.

In the process, the tie bar TB (see FIG. 15) connecting the leads LD is cut. Further, the respective leads LD are separated from the frame part LFf. As a result, the leads LD become independent members that are separated from each other. Further, after the leads LD are separated, the sealing body MR and the leads LD are supported by the frame part LFf through the suspension leads HL (see FIG. 9).

It should be noted that the tie bar TB is cut after the plating process in the description of the embodiment. However, the plating process may be performed after only the tie bar TB is cut first, and further the respective leads LD may be separated from the frame part LFf. Accordingly, the metal film MC can be also formed on the cut surface of the tie bar TB, and the cut surface of the tie bar TB can be suppressed from discoloring due to oxidization. Further, since the plating process is performed before the leads LD are separated from the frame part LFf, the deformation of the leads LD due to a plating liquid can be suppressed.

The leads LD and the tie bar TB are cut by press work using a die for cutting to be described later. Further, the cut leads LD can be molded as shown in, for example, FIG. 2 by bending the outer lead parts OLD of the leads LD by press work using a die for molding (not shown).

The detail of the lead cut process will be described later.

<Dicing Process>

Figure 17:
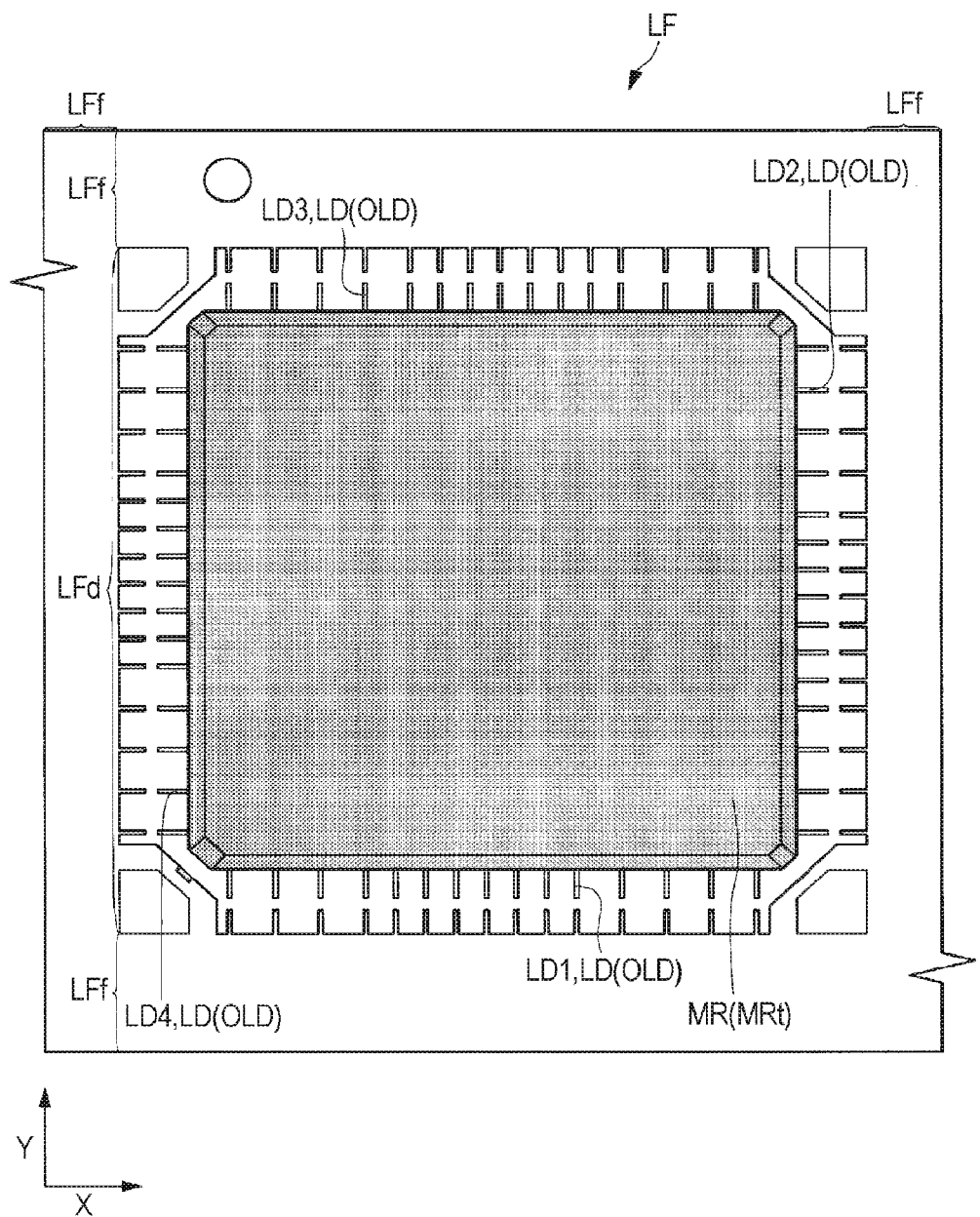
FIG. 17 is an enlarged plan view for showing a state in which the suspension leads shown in FIG. 16 are cut to obtain a semiconductor package.

Next, in a dicing process shown in FIG. 8, the respective suspension leads HL are cut, and the semiconductor package is separated in each of the device formation part LFd as shown in FIG. 17. FIG. 17 is an enlarged plan view for showing a state in which the suspension leads shown in FIG. 16 are cut to obtain the semiconductor package.

In the process, the suspension leads HL shown in FIG. 9 and resin left at the corner parts of the sealing body MR are cut to obtain the semiconductor device PKG1 (specifically, an inspection target before an inspection process) that is a semiconductor package. As a cutting method, for example, the suspension leads HL and the resin can be cut by press work using a cutting die (not shown) as similar to the lead molding process.

After the process, necessary inspections and tests such as an appearance inspection and an electrical test are conducted, and the product that has passed the tests is the semiconductor device PKG1 shown in FIG. 1 to FIG. 7.

The invention achieved by the inventors has been described above in detail on the basis of the embodiment. However, it is obvious that the present invention is not limited to the above-described embodiment, but can be variously changed without departing from the scope of the invention.

Modified Example 1

Figure 18:
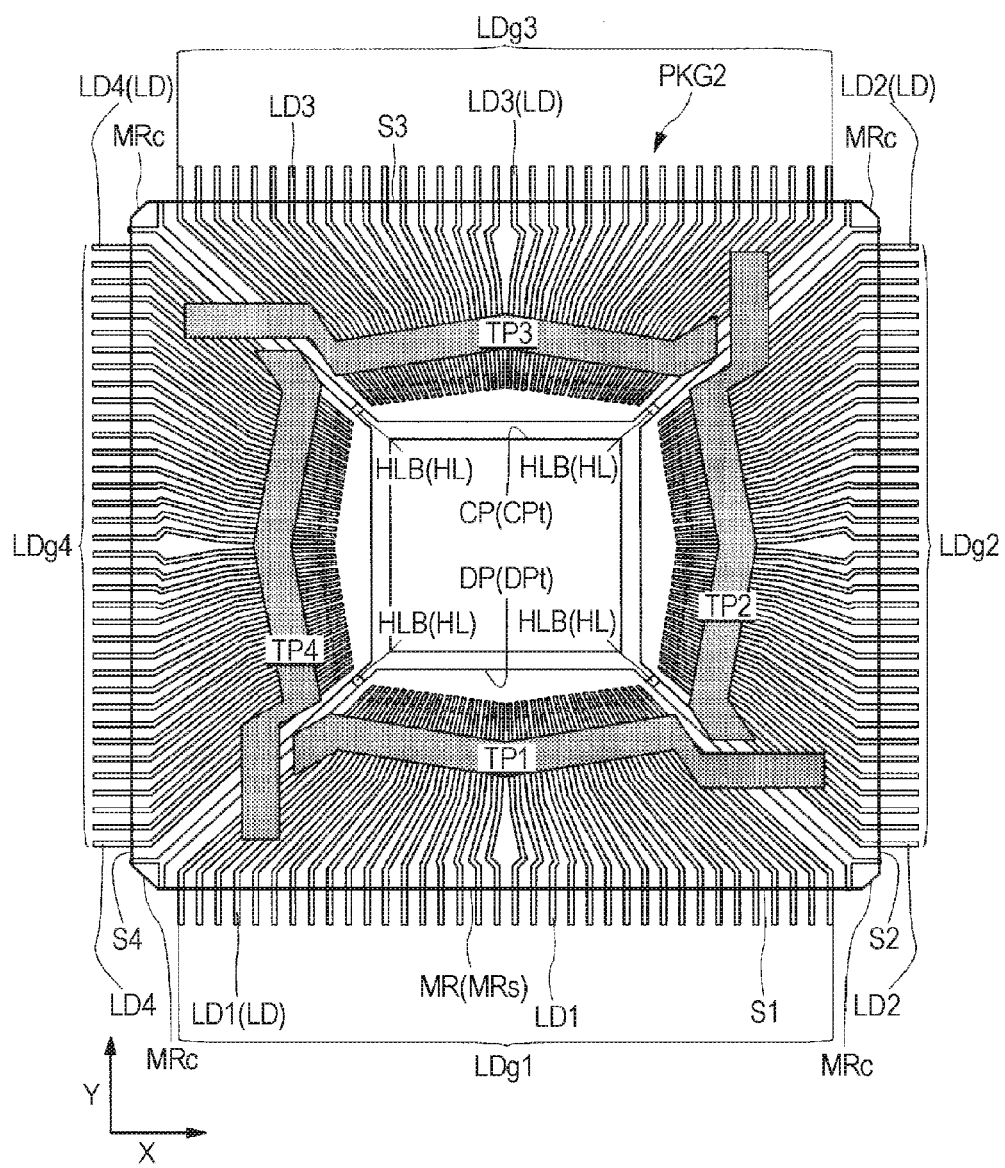
FIG. 18 is a perspective plan view for showing an inner structure of a semiconductor device as a modified example of FIG. 4.

For example, two kinds of tapes are attached in the description of the embodiment by forming the tape TP1 and the tape TP3 in the same shape and by forming the tape TP2 and the tape TP4 in the same shape. However, the tapes TP1, TP2, TP3, and TP4 may be formed in the same shape as in a semiconductor device PKG2 shown in FIG. 18. FIG. 18 is a perspective plan view for showing an inner structure of a semiconductor device as a modified example of FIG. 4. Further, FIG. 19 is an enlarged plan view of the semiconductor device shown in FIG. 18, and shows a modified example of the semiconductor device shown in FIG. 7.

Figure 19:
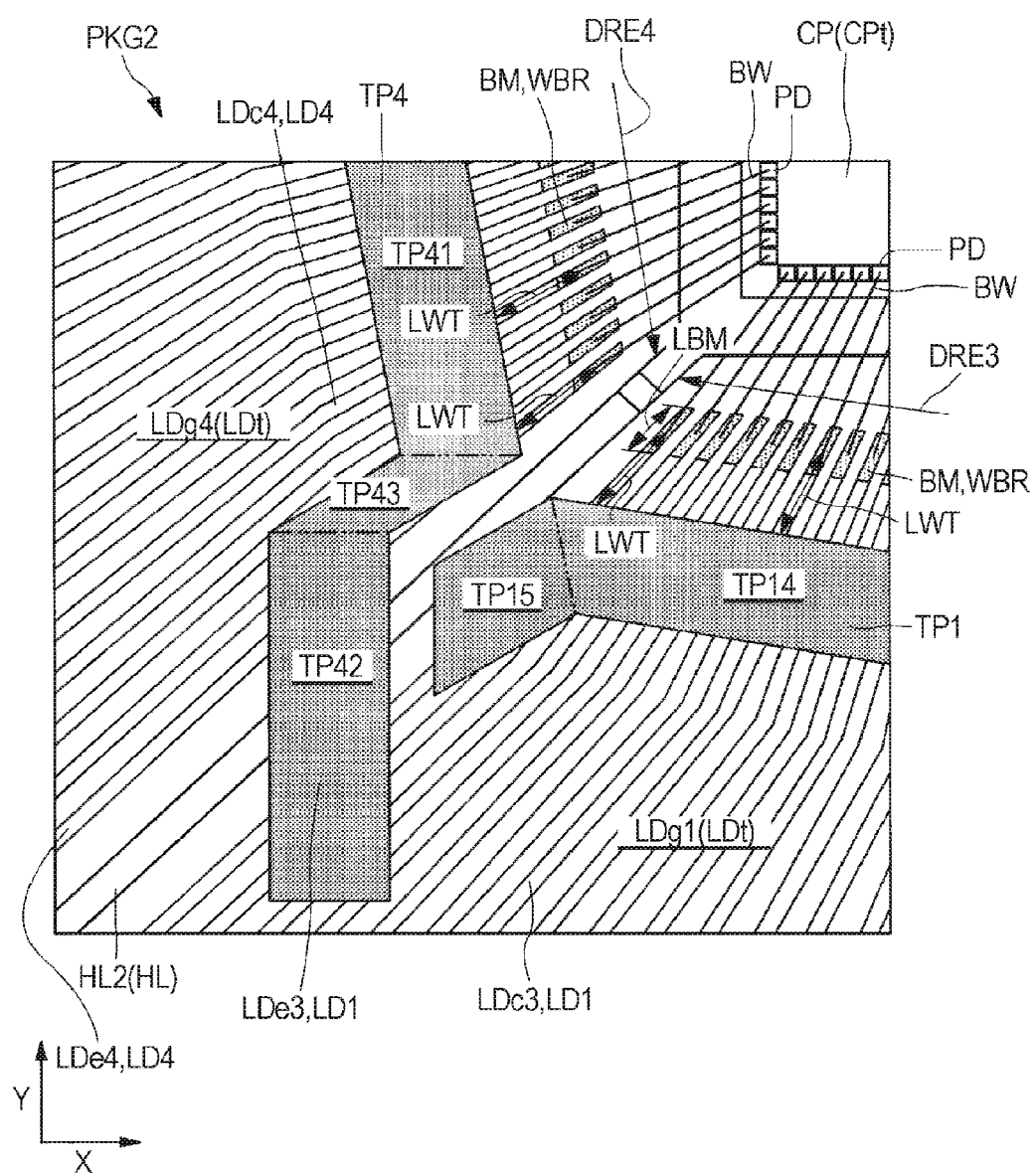
FIG. 19 is an enlarged plan view of the semiconductor device shown in FIG. 18.

The semiconductor device PKG2 shown in each of FIG. 18 and FIG. 19 is different from the semiconductor device PKG1 shown in each of FIG. 1 to FIG. 7 in that the tapes TP1, TP2, TP3, and TP4 are formed in the same shape.

Specifically, as shown in FIG. 19, the tape supporting part TP15 is directly coupled to the lead holding part TP14 of the tape TP1, and the connection part TP16 (see FIG. 7) is not provided between the lead holding part TP14 and the tape supporting part TP15. On the other hand, the tape TP4 has the same structure as the tape TP1 shown in FIG. 5. Namely, the tape TP4 has the lead holding part (a main part, a holding part, or a part) TP41 extended along the wire connecting portion (the parts to which the wires BW are joined in the bonding regions WBR) of the leads LD4 in plan view and is attached to each of the leads LD4. Further, the tape TP4 has the tape supporting part (a supporting part or a part) TP42 attached to the suspension lead HL2 and the leads LD1 (some of the leads LD1) and is attached to a position farther from the wire connecting portion than the lead holding part TP41. Further, the tape TP4 has the connection part (a part) TP43 located between the lead holding part TP41 and the tape supporting part TP42. Further, the tape TP1 has no part overlapping with the tape TP4.

It should be noted that the structure of the end part opposite to the enlarged plane shown in FIG. 19 in the tape TP1 included in the semiconductor device PKG2 is the same as that of the tape TP1 included in the semiconductor device PKG1 shown in FIG. 5, and thus duplicated explanation will be omitted. Further, as shown in FIG. 18, the structure of each of the tapes TP2, TP3, and TP4 included in the semiconductor device PKG2 is the same as that of the tape TP1, and thus the explanation thereof will be omitted.

According to the modified example, since the tapes TP1, TP2, TP3, and TP4 are formed in the same shape, the tapes can be efficiently manufactured as compared to the case in which two kinds of tapes are prepared as in the semiconductor device PKG1 shown in FIG. 4.

It should be noted that the semiconductor device PKG2 is the same as the semiconductor device PKG1 described in the embodiment except for the above-described different point. Thus, the modified example described in the embodiment can be applied in a range where the characteristic of the same shape of the tapes TP1, TP2, TP3, and TP4 is not deteriorated.

Modified Example 2

Figure 20:
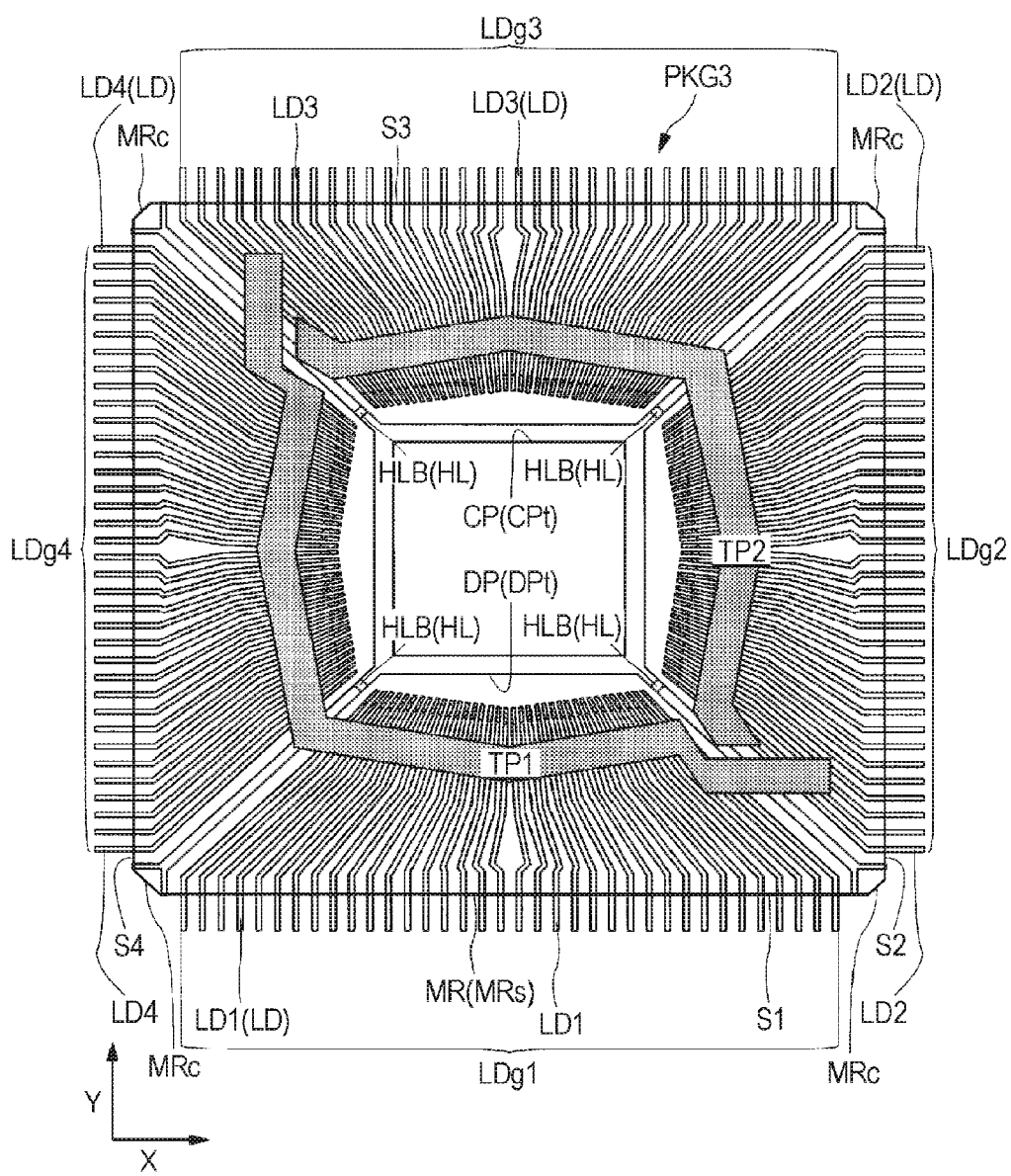
FIG. 20 is a perspective plan view for showing an inner structure of a semiconductor device as another modified example of FIG. 4.
Figure 21:
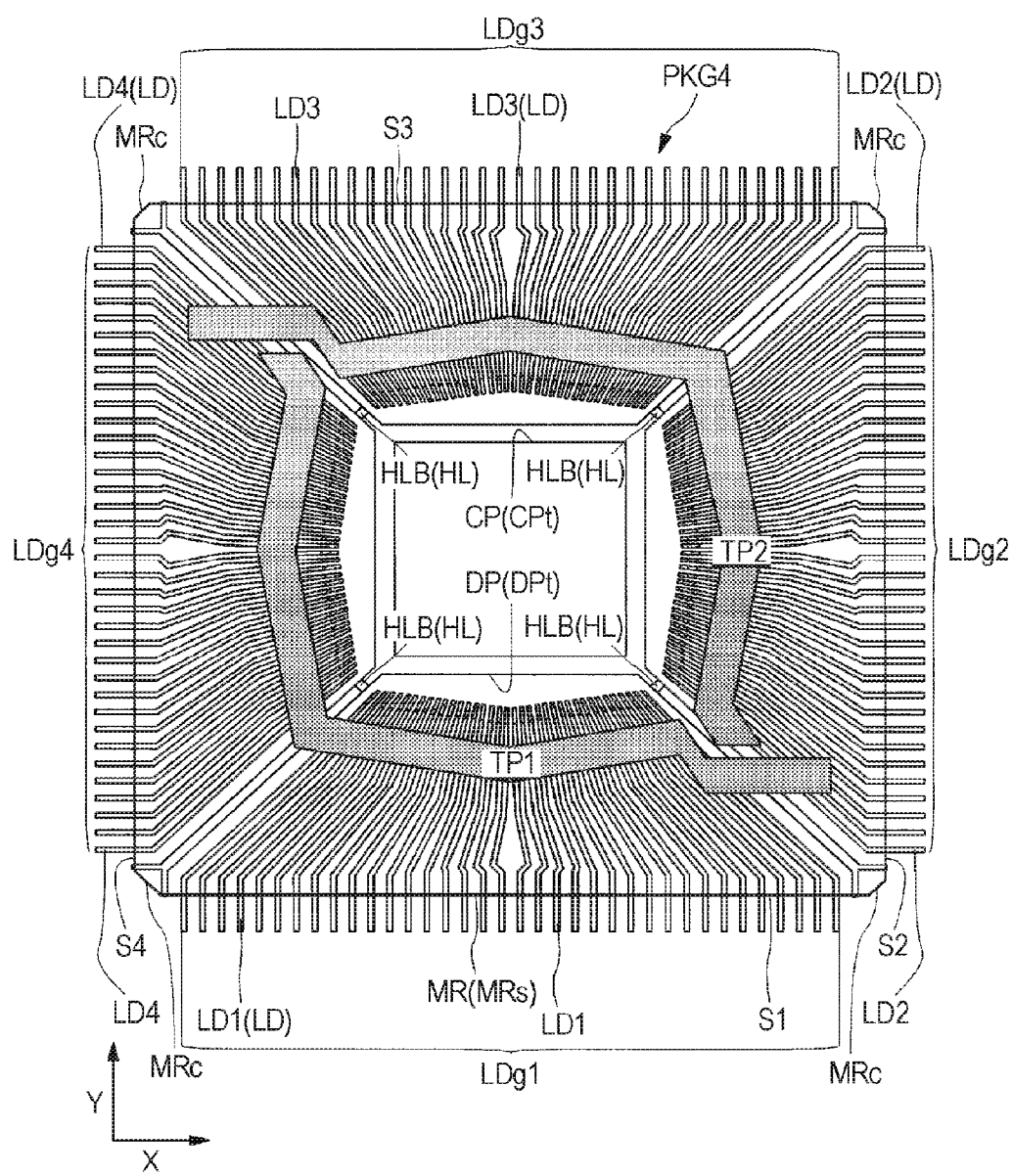
FIG. 21 is a perspective plan view for showing an inner structure of a semiconductor device as a modified example of FIG. 20.

Further, in the description of the embodiment and the modified example, four tapes are attached. However, as in a semiconductor device PKG3 shown in FIG. 20 and a semiconductor device PKG4 shown in FIG. 21, two tapes such as the tape TP1 and the tape TP2 may be attached. FIG. 20 is a perspective plan view for showing an inner structure of a semiconductor device as another modified example of FIG. 4. Further, FIG. 21 is a perspective plan view for showing an inner structure of a semiconductor device as a modified example of FIG. 20. Further, FIG. 22 is an enlarged plan view of the semiconductor device shown in FIG. 20 or FIG. 21, and shows another modified example of the semiconductor device shown in FIG. 7.

The semiconductor device PKG3 shown in FIG. 20 and the semiconductor device PKG4 shown in FIG. 21 are different from the semiconductor device PKG1 shown in each of FIG. 1 to FIG. 7 in that each of the tape TP1 and the tape TP2 holds the leads LD included in the groups of leads provided across the suspension leads HL.

Figure 22:
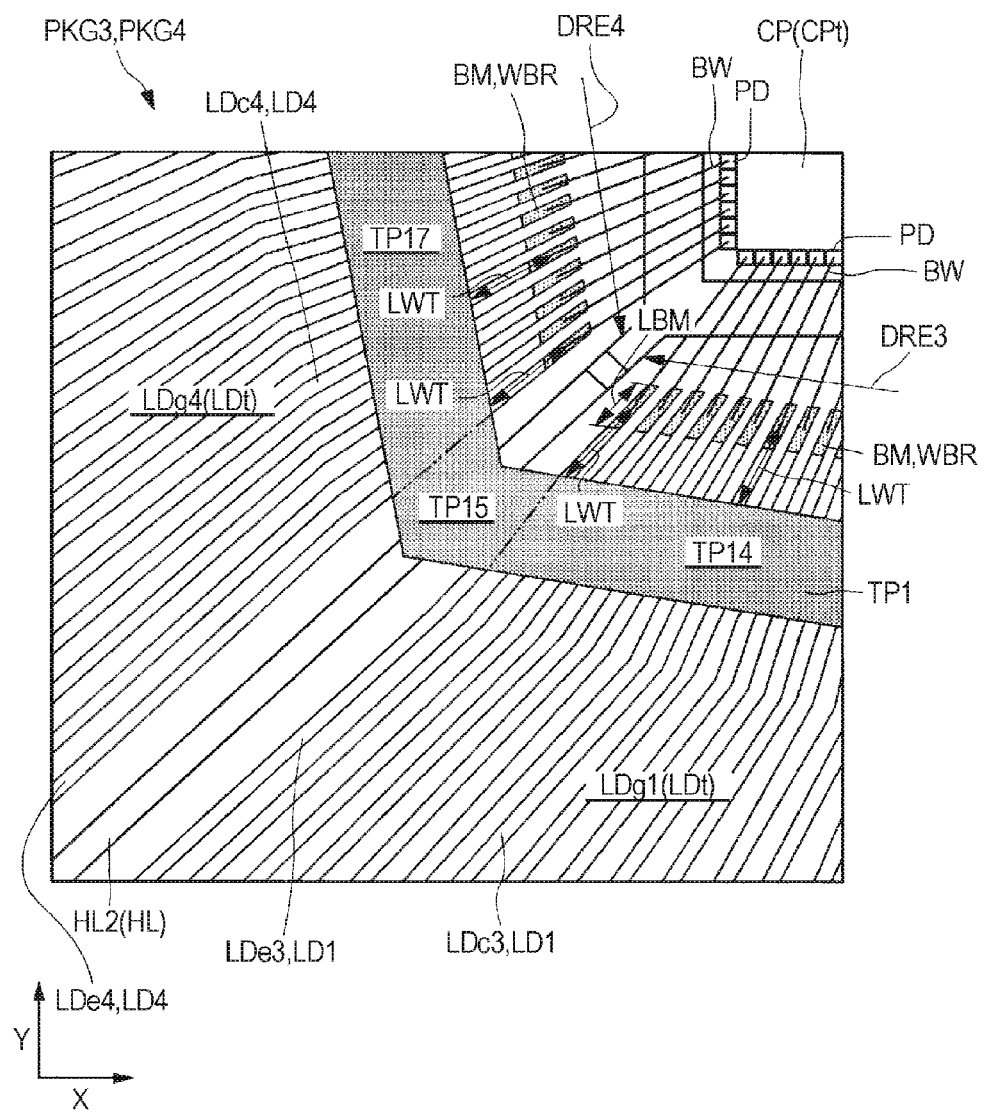
FIG. 22 is an enlarged plan view of the semiconductor device shown in FIG. 20 or FIG. 21.

Specifically, as shown in FIG. 22, the tape TP1 included in each of the semiconductor devices PKG3 and PKG4 is different from the semiconductor device PKG1 shown in FIG. 7 in that the tape TP1 has a lead holding part TP17 holding the respective leads LD4 in addition to the lead holding part TP11 (see FIG. 5) and the lead holding part TP14 holding the respective leads LD1. The tape TP1 of the modified example has the lead holding part (a main part, a holding part, or a part) TP17 extended along the wire connecting portion (the parts to which the wires BW are joined in the bonding regions WBR) of the leads LD4 and is attached to each of the leads LD4. Further, the tape TP1 has the tape supporting part TP15 attached to the suspension lead HL2 and is provided across the lead holding part TP17 and the lead holding part TP14.

In the case of the modified example, each of the tape TP1 and the tape TP2 is an independent member, and is not formed in a ring shape. Thus, the tape acquisition efficiency can be suppressed from being decreased in the tape manufacturing process. Further, in the case where the lead holding part TP14 and the lead holding part TP17 are connected to each other through the tape supporting part TP15, there is no concern that the lead holding part TP14 is overlapped with the lead holding part TP17. Therefore, each of the leads LD1 and each of the leads LD4 can be reliably attached to the tape TP1.

It should be noted that the tape TP2 shown in each of FIG. 20 and FIG. 21 is the same as the tape TP1 except for the shapes of the end parts. Further, the shapes of the end parts of the tape TP1 and the tape TP2 are the same as those of the tape TP1 described using FIG. 5 or those of the tape TP2. Thus, duplicated explanation will be omitted. Further, the semiconductor device PKG4 shown in FIG. 21 is different from the semiconductor device PKG3 shown in FIG. 20 in that the tape TP1 and the tape TP2 of the same shape are attached. Accordingly, the tapes can be efficiently manufactured as compared to the case in which two kinds of tapes are prepared as described in the modified example 1.

It should be noted that the semiconductor device PKG3 and the semiconductor device PKG4 are the same as the semiconductor device PKG1 described in the embodiment except for the above-described different point. Thus, the modified example described in the embodiment can be applied in a range where the characteristic of holding the leads LD1, LD2, LD3, and LD4 by attaching the tape TP1 and the tape TP2 is not deteriorated.

Modified Example 3

Further, for example, various modified examples have been described above, but a combination of the above-described modified examples can be applied.

In addition to the above, a part of content described in the embodiment will be described below.

[Additional Statement 1]

A manufacturing method of a semiconductor device comprising the following steps of:
(a) preparing a lead frame having a first lead group comprised of a plurality of first leads arranged along a first direction, a second lead group comprised of a plurality of second leads arranged along a second direction intersecting with the first direction, a first suspension lead arranged between the first lead group and the second lead group, a die pad to which the first suspension lead is connected, a first tape attached to each of the first leads, the first suspension lead, and some of the second leads, and a second tape attached to each of the second leads;
(b) mounting a semiconductor chip having a plurality of pads on the die pad; and
(c) electrically coupling the pads of the semiconductor chip to the first leads and the second leads of the lead frame through a plurality of wires, wherein each of the first leads, the second leads, and the first suspension lead has a first surface and a second surface opposite to the first surface, wherein each of the first tape and the second tape is attached to the first surface, wherein, in plan view, the first tape has: a first part extended along wire connecting portion of the respective first leads and is attached to each of the first leads, a second part attached to the first suspension lead and some of the second leads and is attached to a position farther from the wire connecting portion than the first part, and a third part located between the first part and the second part, and wherein the first tape has no part overlapping with the second tape.

What is claimed is:

1. A method of manufacturing a semiconductor device, comprising the steps of:
(a) providing a lead frame having a first lead group comprised of a plurality of first leads arranged along a first direction, a second lead group comprised of a plurality of second leads arranged along a second direction intersecting with the first direction, a first suspension lead arranged between the first lead group and the second lead group, a die pad to which the first suspension lead is connected, a first tape attached to each of the plurality of first leads, the first suspension lead and one or more of the plurality of second leads, and a second tape attached to each of the plurality of second leads;
(b) after step (a), mounting a semiconductor chip having a plurality of pads on the die pad;
(c) after step (b), electrically connecting the plurality of pads of the semiconductor chip with the plurality of first leads and the plurality of second leads of the lead frame through a plurality of wires; and
(d) after step (c), sealing the semiconductor chip and the plurality of wires,
wherein, in plan view, the first tape has:
a first part extended along a wire connecting portion of each of the plurality of first leads, and attached to each of the plurality of first leads;
a second part attached to the first suspension lead and one or more of the plurality of second leads; and
a third part located between the first part and the second part,
wherein, in plan view, the second part of the first tape extends across the first suspension lead at a first region of the first suspension lead which is spaced, in a direction away from the die pad, from a second region of the first suspension lead defined by virtual extensions of opposite edges of the first part of the first tape, and
wherein the first tape has no part overlapping with the second tape.

2. The method according to claim 1,
wherein the first lead group has a first end-part lead arranged at a position nearest to the first suspension lead among the plurality of first leads,
wherein the second lead group has a second end-part lead arranged at a position nearest to the first suspension lead among the plurality of second leads, and
wherein the second part of the first tape is attached to the second end-part lead.

3. The method according to claim 2,
wherein the third part of the first tape is attached to the first end-part lead.

4. The method according to claim 3,
wherein the second part of the first tape is attached to one or more of the plurality of first leads.

5. The method according to claim 1,
wherein at least one of the virtual extensions of the opposite edges of the first part of the first tape intersects with a part of the second tape.

6. The method according to claim 1,
wherein, in plan view, at least one of virtual extensions of opposite edges of a fourth part of the second tape attached to the plurality of second leads intersects with the third part of the first tape.

7. The method according to claim 1,
wherein the first lead group has a first end-part lead arranged nearest to the first suspension lead and a first inner lead other than the first end-part lead among the plurality of first leads,
wherein the first part of the first tape and the wire connecting portion of the first end-part lead are arranged apart from each other by a first length,
wherein the first part of the first tape and the wire connecting portion of the first inner lead are arranged apart from each other by a second length, and
wherein the first length is equal to the second length.

8. The method according to claim 1,
wherein each of the plurality of first leads, the plurality of second leads and the first suspension lead has a first surface and a second surface opposite to the first surface,
wherein, in plan view, the second tape has a fourth part extended along a wire connecting portion of each of the plurality of second leads and is attached to the first surface of each of the plurality of second leads, and
wherein, in plan view, a virtual extension of the first part of the first tape and a virtual extension of the fourth part of the second tape intersect with each other at a position overlapped with the first suspension lead.

9. The method according to claim 1,
wherein each of the plurality of first leads, the plurality of second leads and the first suspension lead has a first surface and a second surface opposite to the first surface,
wherein the first lead group has a first end-part lead arranged at a position nearest to the first suspension lead among the plurality of first leads,
wherein the second lead group has a second end-part lead arranged at a position nearest to the first suspension lead among the plurality of second leads,
wherein the second tape has a fourth part extended along a wire connecting portion of each of the plurality of second leads and is attached to the first surface of each of the plurality of second leads,
wherein the first end-part lead has a preform and a first metal film which is formed at a part of the preform and to which one of the first wires is joined,
wherein the first part of the first tape and the wire connecting portion of the first end-part lead are arranged apart from each other by a first length,
wherein the fourth part of the second tape and the wire connecting portion of the second end-part lead are arranged apart from each other by a second length, and
wherein a difference between the first length and the second length is smaller than a length of the first metal film in a lengthwise direction of the first end-part lead.

10. The method according to claim 1,
wherein each of the plurality of first leads, the plurality of second leads and the first suspension lead has a first surface and a second surface opposite to the first surface,
wherein the first lead group has a first end-part lead arranged at a position nearest to the first suspension lead among the plurality of first leads,
wherein the second tape has a fourth part extended along a wire connecting portion of each of the plurality of second leads and is attached to the first surface of each of the plurality of second leads,
wherein the first part of the first tape and the wire connecting portion of the first end-part lead are arranged apart from each other by a first length,
wherein the fourth part of the second tape and the wire connecting portion of a third lead included in the second leads are arranged apart from each other by a second length, and
wherein the first length is equal to the second length.

11. The method according to claim 1,
wherein the first tape and the second tape are separated from each other.

12. The method according to claim 1,
wherein each of the plurality of first leads, the plurality of second leads and the first suspension lead has a first surface and a second surface opposite to the first surface, and
wherein the second tape is attached to the first surface of the first suspension lead at the second region of the first suspension lead.

13. The method according to claim 12,
wherein the second tape does not contact the first leads.

14. The method according to claim 13,
wherein the second tape has a fourth part extended along a second wire connecting portion of each of the plurality of second leads and is attached to the first surface of each of the plurality of second leads, and a fifth part attached to the first suspension lead and extends along an extending direction of the third part of the first tape in plan view.

15. The method according to claim 1,
wherein the width of the second part of the first tape is equal to or larger than that of the first part of the first tape.

16. The method according to claim 1,
wherein each of the plurality of first leads, the plurality of second leads and the first suspension lead has a first surface and a second surface opposite to the first surface,
wherein the first and second tapes are attached to the corresponding leads by the following steps (a1)-(a2):
  (a1) arranging the first and second tapes on the first surfaces of the corresponding leads; and
  (a2) pressing the first and second tapes by a jig while the first and second leads are disposed on a stage.

17. The method according to claim 1,
wherein the second part of the first tape and the first suspension lead intersect with each other at an angle other than 90 degrees in plan view.

18. The method according to claim 1,
wherein the lead frame has a third lead group comprised of a plurality of third leads arranged along the first direction at a side opposite the plurality of first leads, and a fourth lead group comprised of a plurality of fourth leads arranged along the second direction at a side opposite the plurality of second leads, wherein a second suspension lead is arranged between the first lead group and the fourth lead group and is coupled to the die pad, wherein the first tape is attached to each of the first leads, the first suspension lead, one or more of the plurality of second leads, the second suspension lead, and one or more of the plurality of fourth leads, wherein a third tape is attached to the fourth leads, wherein a plurality of third wires sealed in step (d) electrically couple a plurality of third pads of the semiconductor chip to the plurality of third leads, respectively, wherein a plurality of fourth wires sealed in step (d) electrically couple a plurality of fourth pads of the semiconductor chip to the plurality of fourth leads, respectively, and wherein, in plan view, the first tape has a fourth part attached to the second suspension lead and one or more of the plurality of fourth leads, and a fifth part located between the first part and the fourth part and coupled to each of the first part and the fourth part.

19. The method according to claim 1, wherein the lead frame has a third lead group comprised of a plurality of third leads arranged along the first direction at a side opposite the plurality of first leads, and a fourth lead group comprised of a plurality of fourth leads arranged along the second direction at a side opposite the plurality of second leads, wherein a second suspension lead is arranged between the first lead group and the fourth lead group and is coupled to the die pad, wherein a third tape is attached to each of the fourth leads, the second suspension lead, and one or more of the plurality of first leads, wherein a plurality of third wires sealed in step (d) electrically couple a plurality of third pads of the semiconductor chip to the plurality of third leads, respectively, wherein a plurality of fourth wires sealed in step (d) electrically couple a plurality of fourth pads of the semiconductor chip to the plurality of fourth leads, respectively, wherein, in plan view, the third tape has a fourth part extended along a third wire connecting portion of each of the plurality of fourth leads and is attached to each of the plurality of fourth leads, a fifth part attached to the second suspension lead and one or more of the plurality of first leads, and a sixth part located between the fourth part and the fifth part and coupled to each of the fourth part and the fifth part, and wherein, in plan view, the fifth part of the third tape extends across the second suspension lead at a first region of the second suspension lead which is spaced, in a direction away from the die pad, from a second region of the second suspension lead defined by virtual extensions of opposite edges of the fourth part of the third tape.

20. The method according to claim 1, wherein the lead frame has a third lead group comprised of a plurality of third leads arranged along the first direction at a side opposite the plurality of first leads, and a fourth lead group comprised of a plurality of fourth leads arranged along the second direction at a side opposite the plurality of second leads, wherein a second suspension lead is arranged between the first lead group and the fourth lead group and is coupled to the die pad, wherein the first tape is attached to each of the plurality of first leads, the first suspension lead, one or more of the second leads, the second suspension lead, and each of the plurality of fourth leads, wherein a plurality of third wires sealed in step (d) electrically a plurality of third pads of the semiconductor chip to the plurality of third leads, respectively, wherein a plurality of fourth wires sealed in step (d) electrically couple a plurality of fourth pads of the semiconductor chip to the plurality of fourth leads, respectively, and wherein, in plan view, the first tape has a fourth part extended along a wire connecting portion of the respective fourth leads and attached to each of the fourth leads, and a fifth part attached to the second suspension lead and coupled to each of the first part and the fourth part.

21. The method according to claim 20, wherein a third suspension lead is arranged between the third lead group and the fourth lead group, wherein the first tape has a sixth part attached to the third suspension lead and one or more of the plurality of third leads, and a seventh part coupled to each of the fifth part and the sixth part.

* * * * *